(12) United States Patent
Varshneya et al.

(10) Patent No.: US 9,127,911 B2
(45) Date of Patent: Sep. 8, 2015

(54) ELECTRO-OPTIC SYSTEM FOR CROSSWIND MEASUREMENT

(71) Applicant: Deepak Varshneya, Falls Church, VA (US)

(72) Inventors: Deepak Varshneya, Falls Church, VA (US); Steve Griggs, Vienna, VA (US); Larry Jeffers, Minerva, OH (US)

(73) Assignee: DEEPAK VARSHNEYA, Falls Church, VA (US)

( * ) Notice: Subject to any disclaimer, the term of this patent is extended or adjusted under 35 U.S.C. 154(b) by 0 days.

(21) Appl. No.: 14/140,163

(22) Filed: Dec. 24, 2013

(65) Prior Publication Data
US 2015/0176948 A1 Jun. 25, 2015

(51) Int. Cl.
| | | |
|---|---|---|
| G06F 19/00 | (2011.01) | |
| G06G 7/80 | (2006.01) | |
| F41G 3/08 | (2006.01) | |
| F41G 1/00 | (2006.01) | |
| G01C 3/00 | (2006.01) | |
| G01J 1/42 | (2006.01) | |
| G01W 1/00 | (2006.01) | |
| G01P 5/26 | (2006.01) | |
| H01L 27/146 | (2006.01) | |

(52) U.S. Cl.
CPC .. *F41G 3/08* (2013.01); *F41G 1/00* (2013.01); *G01C 3/00* (2013.01); *G01J 1/4257* (2013.01); *G01P 5/26* (2013.01); *G01W 1/00* (2013.01); *H01L 27/14643* (2013.01)

(58) Field of Classification Search
USPC ......... 235/404, 407, 400, 411, 412, 414, 416; 42/111, 114, 146, 130, 122
See application file for complete search history.

(56) References Cited

U.S. PATENT DOCUMENTS

| | | | |
|---|---|---|---|
| 8,196,828 B2 | 6/2012 | Kelly | |
| 8,279,287 B2 | 10/2012 | Belenkii | |
| 8,508,722 B2 | 8/2013 | Rogers et al. | |
| 2009/0100995 A1* | 4/2009 | Fisher | 89/1.11 |
| 2009/0200376 A1* | 8/2009 | Peters et al. | 235/404 |
| 2009/0266892 A1* | 10/2009 | Windauer et al. | 235/404 |
| 2009/0320348 A1* | 12/2009 | Kelly | 42/119 |

(Continued)

OTHER PUBLICATIONS

McCoy, R. L., "Modern Exterior Ballistics," The Launch and Flight Symmetric Projectiles, 2012, Schiffer Military History, Atglen, PA 2012.

(Continued)

*Primary Examiner* — Edwyn LaBaze
(74) *Attorney, Agent, or Firm* — Birch, Stewart, Kolasch & Birch

(57) ABSTRACT

An electro-optic system, e.g., mounted to a weapon, measures down range winds and a range-to-target for compensating the ballistic hit point. The system may include an optical light source, collimated to generate a laser spot on the target. The system may include a wind measurement receiver that captures laser light scattered from the target. The captured light may be modulated by atmospheric scintillation eddies, producing optical patterns which change in time and move with the crosswind. These patterns may be analyzed by a processor using covariance techniques to determine path-integrated crosswinds and associated errors. Ranging is done by measuring the time of flight of the laser pulse to the target collecting the scattered signal from the target. Compensated ballistic hit point, measurement errors and other data may be displayed on a micro-display digital eyepiece, overlaid on the real-time image of the target.

25 Claims, 18 Drawing Sheets

(56) References Cited

U.S. PATENT DOCUMENTS

| | | | |
|---|---|---|---|
| 2010/0282843 A1* | 11/2010 | Staley, III | 235/404 |
| 2011/0132983 A1* | 6/2011 | Sammut et al. | 235/404 |
| 2012/0042559 A1* | 2/2012 | Bockmon | 42/111 |
| 2012/0132709 A1* | 5/2012 | Lowrey, III | 235/407 |
| 2012/0145785 A1* | 6/2012 | Scrogin et al. | 235/404 |
| 2012/0273571 A1* | 11/2012 | Kremer | 235/404 |
| 2013/0206836 A1 | 8/2013 | Paterson et al. | |
| 2014/0110482 A1* | 4/2014 | Bay | 235/404 |
| 2015/0008260 A1* | 1/2015 | Volfson | 235/404 |

OTHER PUBLICATIONS

R.S. Lawrence et al., "Use of Scintillatins to Measure Average Wind Across a Light Beam," Feb. 1972, pp. 239-243, Applied Optics vol. 11, No. 2.

Wahlde et al., "Sniper Weapon Fire Control Error Budget Analysis," ARL-TR-2065, U.S. Army Research Laboratory, Aberdeen Proving Ground, MD, Aug. 1999, pp. 1-75.

Wang et al, "Wind Measurements by the Temporal Cross-Correlation of the Optical Scintillations," Dec. 1, 1981, pp. 4073-4081, vol. 20, No. 23, Applied Optics.

\* cited by examiner

ELECTRO-OPTIC SYSTEM FOR CROSSWIND MEASUREMENT

FIELD OF THE INVENTION

The present invention is directed to a system and method for measuring downrange path integrated winds and a range-to-target for purposes of compensating a ballistic hit point.

BACKGROUND OF THE INVENTION

Deer hunting sport has been practiced for many centuries. Better materials, better weapon designs and ammunitions allow hunters to engage targets at longer ranges and with more precision than was possible in the past. Typical rifles such as Remington® model 243 allow engagements to ranges greater than 400 meters. However, it has been recognized that there are a number of factors that affect the position of the projectile hit point. Two dominant sources of hit point errors are the uncertainty in the estimation of the magnitude and direction of path integrated crosswind and the range to target. The effect of these errors on the hit point grows substantially as the standoff range between the hunter and the target increases and/or the crosswind increases. FIG. 1 shows the effect of uncompensated average crosswind and imprecise range measurement on hit probability for a 12 inch diameter target, as a function of range. The graph shows that for an average downrange crosswind of approximately 5 miles per hour (mph) and a 10% range uncertainty, the 243 caliber bullet misses the target aim point at 400 meters by over 13 cm. The effect is much worse at longer ranges, for instance, the bullet misses the target by 31 cm at a range of 600 meters, while missing the target by 63 cm at a range of 800 meters. Because a hunter cannot easily and accurately estimate the average wind and range to the target, there is a reduced probability of a first round target hit. During the day, an experienced user can estimate the crosswinds by viewing the mirage through the riflescope or the vegetation motion and the range to target by comparing the target size to the crosshair reticle but is unable to conduct these functions during the night or in twilight. Improved methods implemented include an anemometer at the hunter's location to estimate local winds and a laser range finder to estimate the range. If wind and range estimates were available, a ballistics calculator may then be used to calculate the wind and vertical hold offset coordinates. Even these advancements are inadequate. The anemometers just measure the local winds, while handheld range finders are difficult to keep on target, providing inaccurate results. Downrange winds can be significantly different than local winds; they can be non-uniform and change direction and/or amplitude along the flight path. These changes can be due to causes such as non-uniform terrain channeling and environmental pressure or temperature differential changes. For example, the effect of downrange winds on the hit point may be negligible if the crosswinds of same amplitude are blowing in one direction for one part of the path and in the opposite direction for another part of the path cancelling the overall projectile deviation. Because the local wind sensor cannot measure downrange winds, it provides an offset that would lead to a target miss.

Recent art, as disclosed in US Patent Application Publication No. 2013/0206836 A1, teaches the use of various forms of internal or external wind sensors at the user's position; all of which measure local winds. The assumption made in the previous art is that the downrange crosswinds are the same as measured by the local wind sensor. Experienced users know that this assumption is inaccurate because the projectile in flight integrates the winds as it flies along its trajectory to the target.

US Patent Application Publication No. 2013/0206836 A1 teaches the option of using LIDAR or laser Doppler Anemometry (or velocimetry) for wind measurement. The LIDAR method cannot easily measure projectile path crosswinds unless measurements are made in three known off-axial directions and the path-average crosswind calculated from the vector addition. This means that the measurement is not made close to the path the projectile travels. In addition the system requires impractical laser powers to achieve high accuracy at even modest ranges because the back-scattered signal modulated from aerosols in the atmosphere is approximately 6 orders of magnitude smaller than a modulated signal scattered from a solid target surface. Clear days, with high visibility to 23 km, can further reduce the range of engagement. This imposes stringent demands on required laser power, laser current drivers, power supply and signal processing, making the system size too big for practical mounting on the weapon. The Laser Doppler Anemometry approach to measuring winds involves detecting the scatter from particulates passing through a small volume generated at the intersection of two interfering laser beams. It is therefore a point measurement, and does not provide path-integrated wind from the shooter to the target.

Downrange path-integrated crosswind measurements from the shooter to the target are necessary to accurately predict the hit point of a projectile. Because the opportunity to engage and hit the target is time sensitive, all measurements must be done in near real time to calculate and display the offset aim point (OAP) in the user's sight; otherwise the opportunity may be permanently lost.

Other prior art, as disclosed in U.S. Pat. No. 8,196,828, proposes to measure downrange integrated crosswind using a laser collimated beam, single aperture and a single imager. In this approach, a high speed camera is used to image the laser spot on the target with a frame rate high enough to freeze the motion of the time varying scintillation pattern. The outbound laser beam is modulated by the atmospheric turbulence producing a time varying pattern of light and dark spots on the target that move and change with the wind. By measuring the time-lag covariance of geometrically-related pixel pairs in a series of recorded camera frames, the path-averaged crosswind can be calculated. This approach suffers from several drawbacks, including: 1) the effect of the return path turbulence on the signal scattered from the target acts as a noise source reducing the overall signal to noise ratio; 2) because the ability to resolve the light and dark spots on the target is limited by diffraction of the collecting lens aperture, large lens apertures (in excess of 100 mm) are required thus increasing the size of the system; 3) higher laser signal power is required because the returned signal spreads over many pixels due to aperture diffraction requiring higher optical power per pixel to measure the crosswind, thus significantly affecting battery life; 4) the approach is sensitive to scintillation index, which reduces the size of the dark and light spots at higher indices exceeding $10^{-13}$, requiring even higher optical resolution (i.e., an aperture larger than 100 mm and more optical power).

Other prior art, U.S. Pat. No. 8,279,287 and U.S. Patent Application Publication No. 2010/0128136, propose to measure downrange path integrated crosswind using a passive method. The technique uses at least two apertures with each aperture passively imaging the target without active light illumination. The atmospheric turbulence modulates the image of the target which appears wavy due to low-frequency wind motion. Using block matching processing approach, the transit time difference in the waviness of a single or multiple features from the two images of the target is measured to deduce the path-integrated crosswind. The approach requires multiple high contrast features on the target or sharp target edge that must first be identified using an imaging sensor and then processed to measure the time difference. Uniform targets without features or that blend into the background (camouflaged) cannot be resolved easily. To resolve the target features (approximately 1 cm) at 1 km, diffraction limited lens diameter of approximately 150 mm at visible wavelengths is required. The size of two such lenses makes the device impractical for mounting on a weapon.

Another approach is described in the article by Wang et al., "Wind measurement by the temporal cross-correlation of the optical scintillations," Applied Optics V20, No. 23, December 1981. This article describes a breadboard system for measuring the path averaged crosswind configured such that a laser source at one end transmits light through the atmospheric turbulence and is detected by a pair of side by side optical receivers located at the other end. This one-way transmission system method can measure path-integrated average crosswinds using several processing techniques. All of these processing techniques are based on observing the wind-driven motion of the scintillation pattern that transits across the line of sight. For the hunting application, the one-way transmission system is clearly impractical because the laser and optical receivers must both be on the same side (user's end) of the path.

When adapting this one-way transmission system to a two-way reflective system, one of the key problems encountered is the laser speckle noise generated from the illuminated target. Laser speckle is an interference effect that creates non-uniform distribution of the light intensity (light and dark spots) when laser light reflects back from a target surface that has a surface roughness smaller than the coherence length of the laser. The speckle problem does not exist in the one-way system because light does not scatter from a target. In the two-way case, the laser light is scattered from the target and collected by the receivers located near the light source. Speckles generated at the target and reflected back appear similar to the scintillation pattern signal, which is created by atmospheric turbulence and used for measuring winds. As a result the covariance function is disturbed by the interference from speckle effects causing large errors in the wind measurement. To address this problem, a laser source with a short coherence length, compared to the target roughness, is required.

Because the aforementioned article by Wang et al. described a field experiment, the system disclosed therein did not have any size, weight and power constraints to meet. Any practical weapon mounted device, demands a compact size that can be operated for extended periods on one battery charge. As the diameter of the receiver lens decreases to allow a more compact system package, the received signal level goes down and aperture diffraction spreads the focused image over a larger area (a higher number of pixels if a camera receiver is used) which results in reduced SNR per pixel even if the total energy over all pixels is summed. This limits the size of the receiver lens that can be used. In the same way, if a laser divergence of 100 micro radians is required to ensure that a laser spot appears on the target at maximum range, the diffraction limits the minimum achievable lens diameter at that wavelength. Large transmitter and receiver apertures impose size constraints in designing a weapon mounted or portable compact system package.

In designing a compact system to measure a path-weighted average crosswind and a range-to-target, it would be advantageous to provide the user with an offset aim point (OAP) indicator in the sight that considers the second order effects from other variables such as: temperature, pressure, humidity, rifle-cant and tilt, ammunition type, etc. Sensors to measure these parameters should be small enough to not impact the size of the package significantly. Furthermore the package must be rugged enough to withstand the shock from repeated weapon firings. These constraints impose yet more challenges in the innovation of a small and portable system useful for operation on or off a weapon.

SUMMARY OF THE INVENTION

According to an exemplary embodiment, the present invention is directed to a portable system including an optical transmitter, an optical receiver, a display device, and a processor. The processor is programmed to receive signals from the optical receiver that are representative of light transmitted by the optical transmitter and scattered back from a target; process the received signals to determine a path-weighted average crosswind between the transmitter and the target, and a range to the target; and calculate, based on the path-weighted average crosswind and the range, an offset aim point for display on the system device. This system may be mounted to a weapon such as a rifle, gun, archer's bow, or crossbow or may be used as a standalone system to measure path-weighted average crosswinds.

The optical transmitter may be configured to produce a collimated beam that may create a small light spot on the target. Also, the optical receiver may be configured to include first and second wind measurement channels separated from one another in a horizontal direction or in a vertical direction by a predetermined distance to measure the horizontal or vertical component of the crosswind. These first and second wind measurement channels may be used for detecting light reflected from the target which travels back toward the system through atmospheric turbulence eddies which move with crosswinds. Particularly, an image sensor may detect such light via said first and second wind measurement channels, respectively, at a measurable time difference. Since this time difference is dependent on the downrange crosswind speeds (as well as the predetermined distance separating the first and second wind measurement channels), the system is able to determine a path-weighted average crosswind in the horizontal direction by the measurement of transit time difference.

Furthermore, the processor may obtain repeated measurements of the aforementioned transit time difference based on the detection results of the first and second wind measurement channels. Based on these repeated measurements, the processor can calculate respective crosswind values and average them together to obtain the path-weighted average crosswind. Furthermore, the processor can calculate a confidence metric representing the accuracy of the determined path-weighted average crosswind based on a variance of the repeated measurements.

In addition, the processor may apply one or more weighting functions which are applied to the detection results of the first and second wind measurement channels, such weighting functions representing contributions from respective segments of a downrange crosswind. Multiple weighting functions may be applied by changing the divergence of the laser beam from the optical transmitter, or else by extracting laser beam spots of different angular sizes from image data captured by the wind measurement channels.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention. A brief description of these drawings is as follows.

DETAILED DESCRIPTION

An exemplary embodiment of a system, which is referred to hereinafter as the "XeroWind System" (or "XWS" for short), is designed for use as a replacement to the riflescope to not only measure the crosswind and range but also to provide an image of the target for acquisition and aiming. According to one alternate embodiment, however, the XWS may be configured as a clip-on so that the users may retain their direct-view riflescopes if desired. In another alternate embodiment, the XWS may be used as a standalone system mounted to a tripod for assisting a spotter. The system can measure the path-weighted average crosswind between the user and the target, the range to the target, and then, using the ammunition characteristics (mass, size, shape, muzzle velocity), atmospheric data and weapon angles, and other data, it calculates the azimuth and elevation offset aim points (OAP) to compensate for the wind deflection and ballistic drop of the ammunition used. The calculated offsets and the confidence metric may be displayed as icons overlaid in the target image which is used by the hunter to re-position the weapon aimpoint. When the confidence icons have converged to approximately the size of the target, this can alert the hunter to fire the weapon. If the confidence icons are close to the target size and not changing rapidly, the user can be confident that the measurement will be valid for sufficient time to engage the target. The system may also provide for downloading the static target image or a short video clip onto a cell phone or other computing device.

Figure 1:
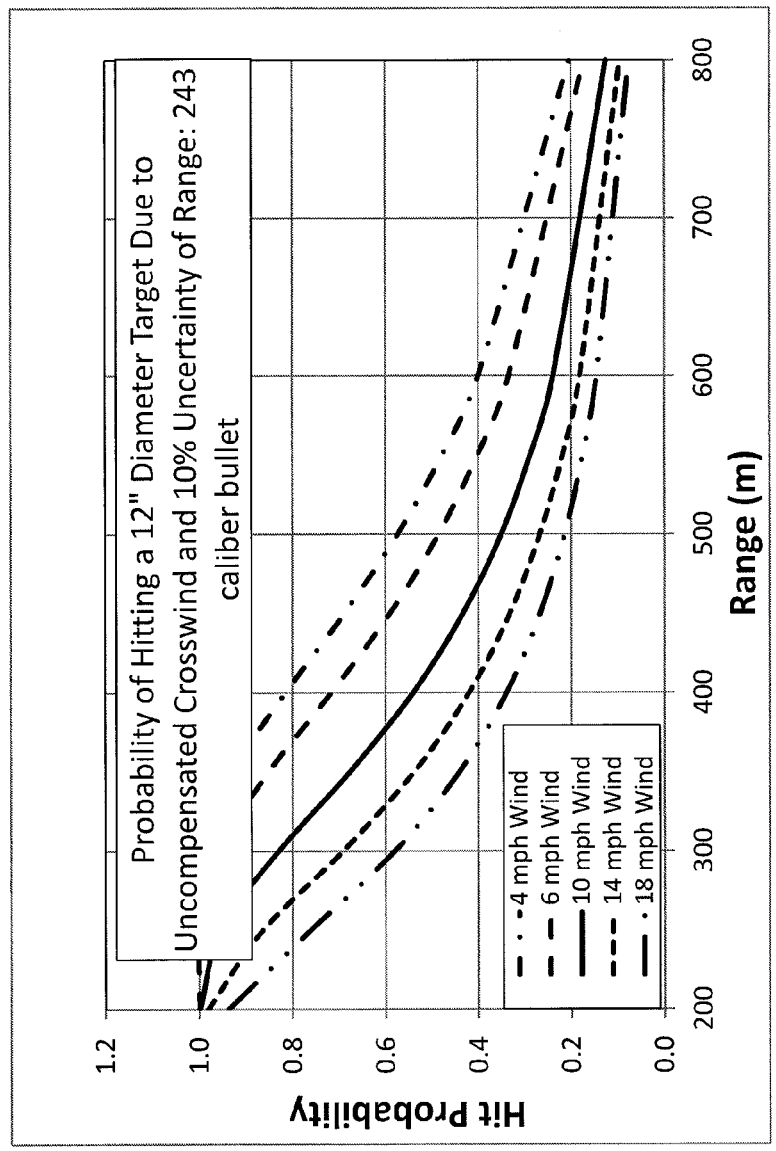
FIG. 1 is a diagram illustrating effects of uncompensated crosswinds and imprecise range measurement on the hit probability.
Figure 2:
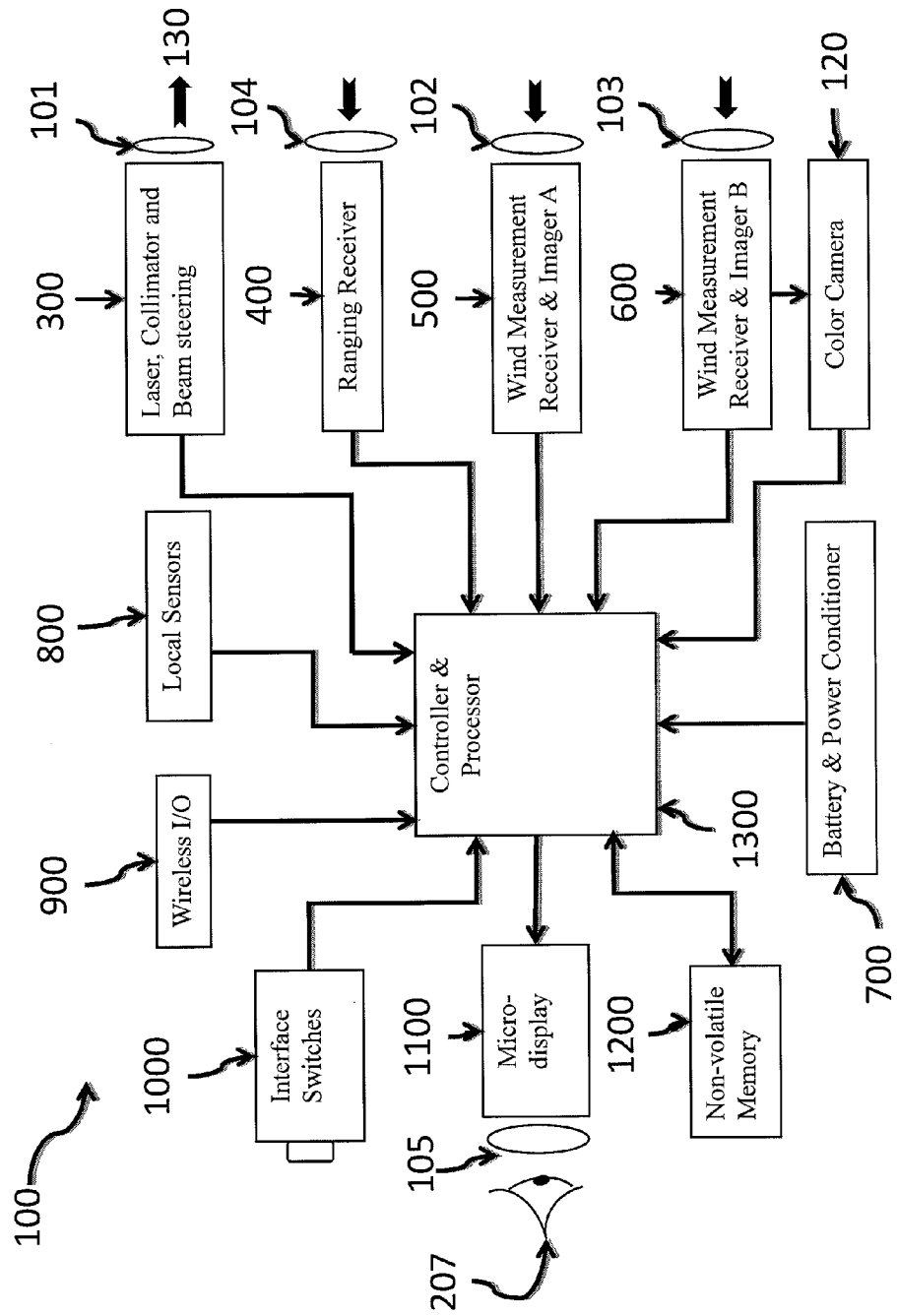
FIG. 2 is a block diagram of an electro-optic system for measuring crosswind, according to an exemplary embodiment of the present invention.
Figure 8:
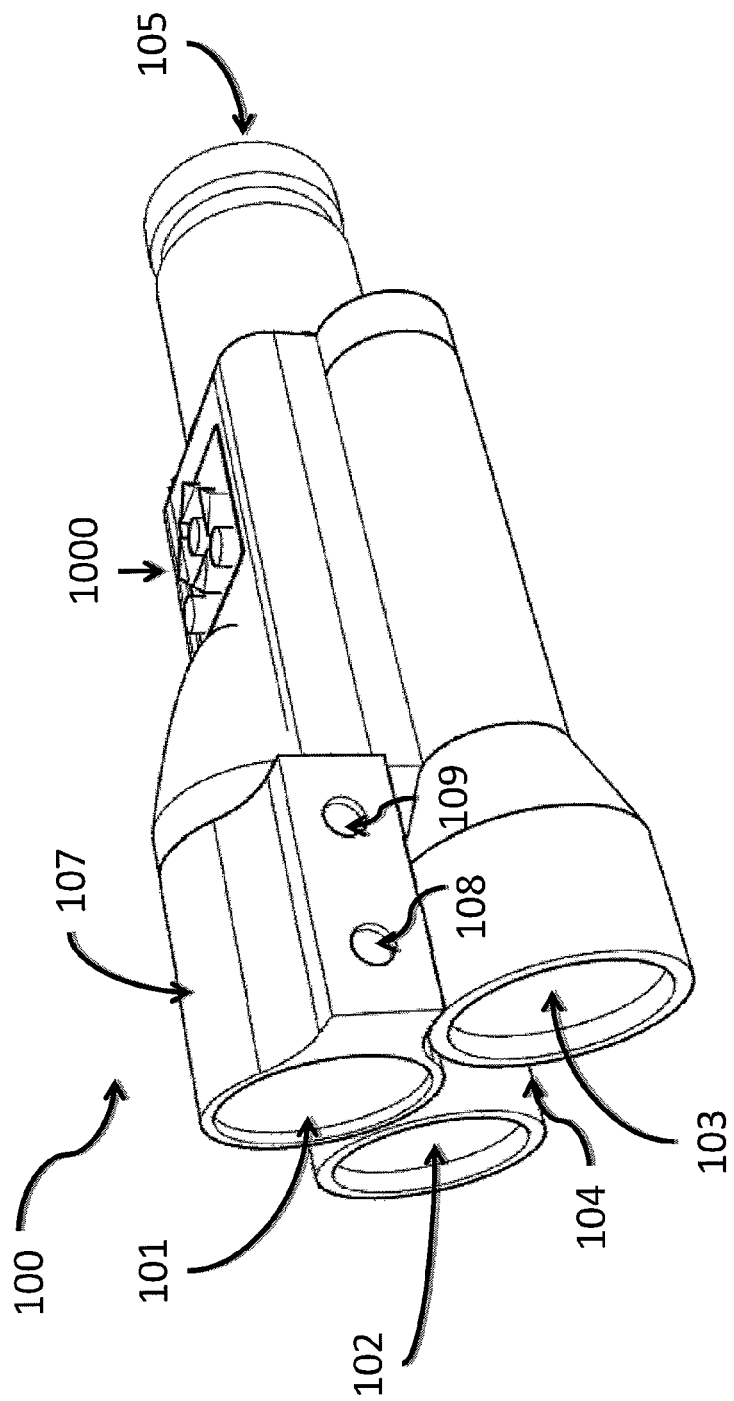
FIG. 8 and FIG. 9 illustrate respective external views of implementation of a rifle-mounted electro-optic system for measuring crosswind, according to an exemplary embodiment of the present invention.
Figure 9:
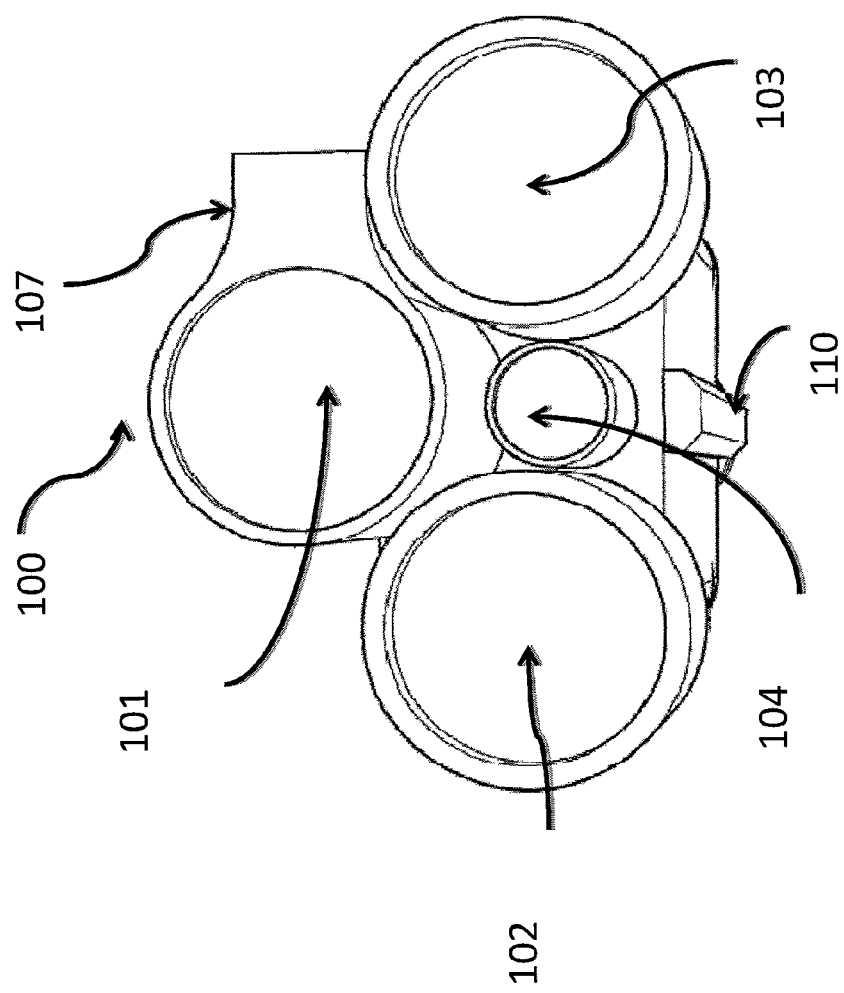
Figure 19:
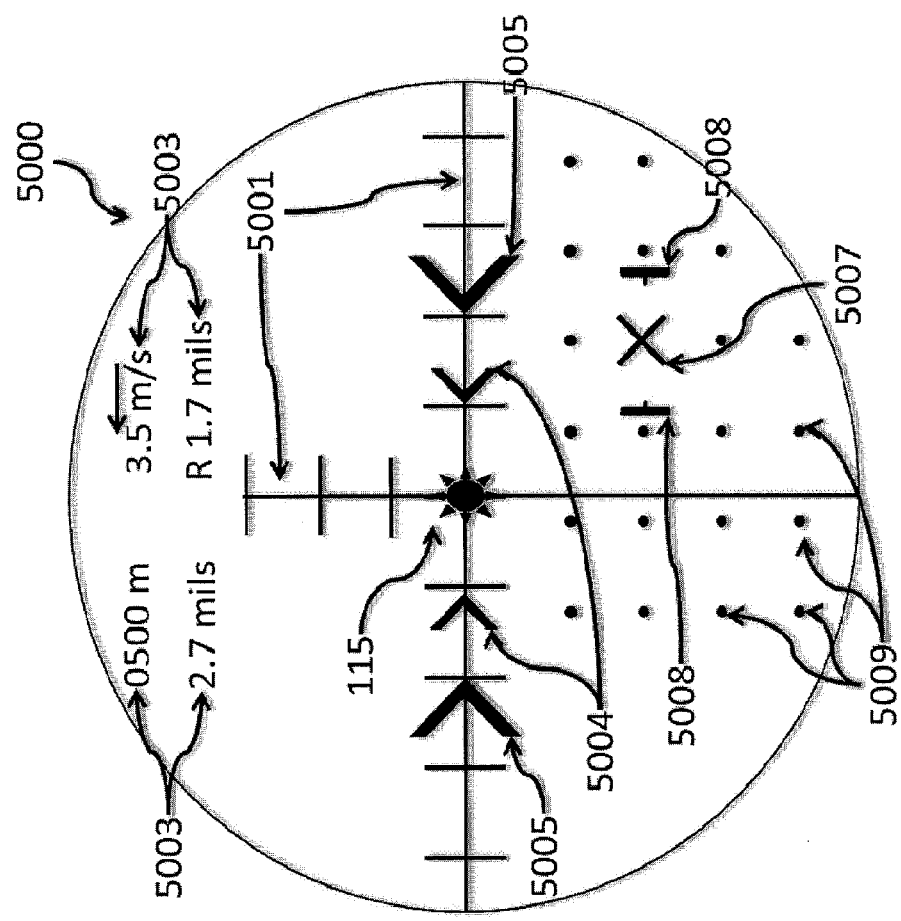
FIG. 19 illustrates an example of the target image overlaid with the offset aim point (OAP), confidence metric indicator arrows, electronic crosshair and other calculated parameters, according to an exemplary embodiment of the present invention.

FIG. 2 is a functional block diagram showing the major subsystems of a rifle-mounted XWS 100. The XWS 100 employs a laser transmitter 300 as an optical source and two optical receivers 500, 600 that are located in a rugged housing (which is shown in FIG. 8 and FIG. 9). The housing may be clamped to the weapon using a mounting point (e.g., element 110 of FIG. 9) allowing the system to measure path integrated crosswind and range to a target when requested by the user via, e.g., a push button switch 1000 positioned near the trigger at convenient location. Using a measured crosswind value and a range value to the target, as well as other possible measurements which will be described later (e.g., meteorological data, projectile characteristics, weapon orientation, location, and motion), the XWS 100 then calculates an offset aim point in the azimuth and elevation directions and displays these offsets in real time to the user in a micro-display 1100, which is viewed through a set of lenses configured into a magnifying eyepiece. Due to variable conditions such as temporary downrange wind gusts, the accuracy of the wind measurement can vary with time and conditions. The system therefore may also calculate wind measurement errors that are displayed to the user as a "confidence metric" letting the shooter know when it is a good time to engage or wait for better shooting condition (FIG. 19 illustrates an example of displaying a confidence metric through the use of arrows 5004 and 5005).

Figure 13:
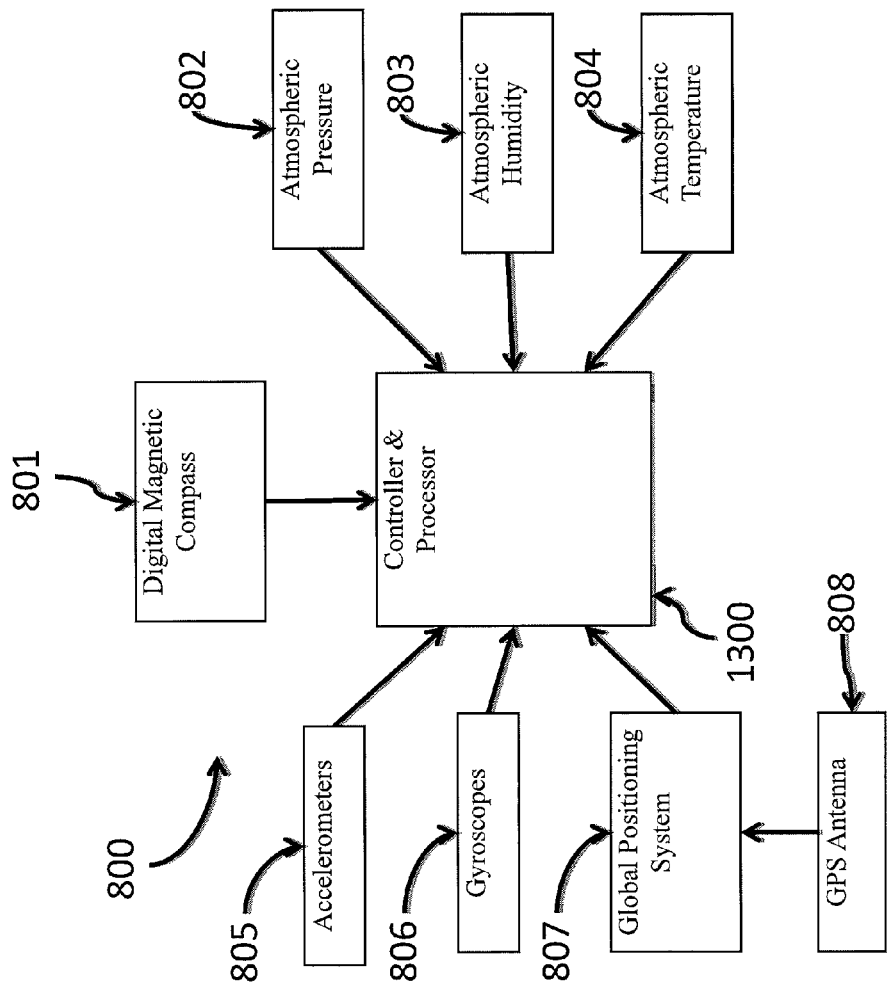
FIG. 13 is a block diagram illustrating various sensors used by a processor to calculate the ballistics offset aim-point, according to an exemplary embodiment of the present invention.

The laser system 300 includes a semiconductor diode and collimation optics to generate a narrow beam on the order of 50 micro radians. It may also provide the illumination for imaging the target area during the night, e.g., when a holographic disperser is used in its path to produce a second larger divergence beam (on the order of 44 milli-radians). The 50 micro radian narrow laser beam is used for measuring range and wind using a ranging receiver 400 to detect and analyze the reflected returns when the laser is in the ranging mode, and two wind measurement channels 500 and 600, which are optical receivers with panchromatic image sensors that detect the laser returns when in the wind measurement mode. One wind measurement channel 600 may also image the target area on a high-resolution color image sensor 120 (also shown in FIG. 6), and provide the image signal to the micro-display 1100. A number of local sensors 800 (which, as shown in FIG. 13, may include: environmental or meteorological (met) sensors 802, 803, and 804, GPS 807, digital magnetic compass (DMC) 801, accelerometers 805 and gyroscopes 806) can be used to supply data used by the ballistic calculator. Wireless Input/Output system 900, potential components of which are shown in further detail in FIG. 14, may allow the user to input data for the ammunition and rifle type. Push button switches 1000 allow the user to select the mode of system operation, color micro-display 1100 provides the user with a high resolution image of the target area overlaid with a digitally generated crosshair and the aim point offsets, non-volatile memory 1200 holds the processing and control software. The controller/processor 1300 provides the signal processing necessary to determine the wind and range as well providing the central control for the system. A battery with a power conditioner 700 provides the required power to all sub systems. The function of all these subsystems and components is described below in detail.

Prior to use, the laser beam may be aligned to the weapon barrel so that when the weapon is aimed at a target, the laser spot will be on the target. Light reflected/scattered from this spot travels through the atmosphere and a portion of this light may be collected by the optical receiver, which is comprised of the wind measurement channels 500, 600. In an exemplary embodiment, the receiver has two equal size apertures 102 and 103 mounted horizontally for measuring crosswind in one dimension (i.e., horizontal crosswind). Because of the atmospheric turbulence, the intensity of the light is modulated at the wind measurement channels 500, 600 creating a pattern of randomly sized bright and dark spots. This pattern is carried over by the path crosswind from one receiver to the other. The optical lens at aperture 102 of wind measurement channel 500 focuses the time varying pattern on the camera pixels or in a different configuration on a single PIN photodiode or APD (avalanche photodiode) detector. Similarly, the lens at aperture 103 of wind measurement channel 600 focuses the pattern on the camera pixels, PIN photodiode or APD. Due to the motion of the path crosswinds, the pattern arrives at the lens of aperture 103 at a slightly different time than at lens of aperture 102. The separation between the two apertures 102, 103 divided by the calculated transit time of the signal is proportional to the magnitude of the path integrated crosswind. The direction of the crosswind is determined by the transit direction of the pattern from aperture 102 to aperture 103. The design requires careful selection of the receiver separation allowing measurement of a large range of crosswinds while ensuring the scintillation pattern stays undisturbed during transit from aperture 102 to 103. In the preferred embodiment, if the center to center separation is selected to be approximately 50 mm, it is possible to measure path-integrated winds from 0.5 m/s to over 15 m/s.

To determine the transit time, a covariance technique may be used to calculate the downrange path integrated crosswinds from the detection results of the two wind measurement channels 500, 600. Four potential covariance-based techniques, any of which can be used for this purpose, are described in Wang et al., "Wind measurement by the temporal cross-correlation of the optical scintillations," *Applied Optics* *V*20, No. 23, December 1981, the contents of which are herein incorporated by reference in their entirety. All have their strengths and weaknesses. In one embodiment, the peak shifting method may be employed, and augmented with various noise filtering and signal averaging methods to improve the SNR. Utilizing the peak method, the time to transit between apertures is determined by calculating the cross covariance function of the two signals and noting the time at which the function peaks. The crosswind may then be calculated as the effective aperture separation divided by the time delay to the peak. A single wind measurement may typically be made within 0.5 to 1 seconds. When the user pushes a switch 1000 to initiate a wind measurement, the system first records several frames (nominally 10) with the laser off. The laser may then turn on, and the data acquisition may continue until a set number of frames have been recorded. The laser-OFF frames are averaged together and subtracted pixel-by-pixel from each of the laser-ON frames in order to remove any background that does not change with the wind. After background subtraction, the processor 1300 may identify the location of the laser image spot by its signal level above the other pixels. Because the laser spot is spread over several pixels the signals from all of the pixels with laser illumination are summed to give the total power captured by the receiver's pupil 102, 103.

The aforementioned embodiment utilizing the peak method provides a weighted average of the crosswind along the path from the shooter to target. Some portions of the path have a greater effect on the average than do others. The same is true of the crosswind effect on the deflection of the projectile. Wind near the shooter affects the trajectory more than the wind near the target. The effect is quantified in the ballistic influence function. Ideally, the wind measurement weighting function is designed to match the ballistic influence function. By optimizing the receiver aperture size and the divergence of the laser beam, an approximate match of the weighting function is made to the ballistic influence function, as will be described in more detail below in connection with FIG. 15.

Once the path average integrated crosswind has been measured (by using the peak method or another cross-covariance technique), it may be processed according to a ballistic aim-point calculating software that provides an offset aim point (OAP). Various types of software, which are capable of providing such an OAP using the measured path integrated crosswind, are commercially available including PRODAS (by Arrow Tech Associates Inc.), ATrag™ (by Horus Vision, LLC) and others. When the OAP is determined, it is displayed by the micro-display 1100 to the users 207 via the eye piece 105 for re-aiming the weapon. Before an OAP can be calculated, inputs from the local sensors 800 (such as a digital magnetic compass 801, global positioning system 807, and/or the atmospheric data sensors 802, 803, 804 illustrated in FIG. 13), ammunition data, and the range may also be required by the ballistic calculator. In an exemplary embodiment, the process of calculating the OAP may be performed in near real-time using standard FPGAs (field-programmable gate arrays), and the result is updated approximately every 0.5 sec or faster. In addition, each update of the OAP may be calculated with a confidence metric, which is a function of the standard deviation of the wind measured using a cross-covariance technique. This confidence metric may also be displayed in the user's sight, e.g., in the form of various shapes such as converging arrows, circle, etc. In the example where the confidence metric is comprised of converging arrows, as measurements continue and the SNR (signal to noise ratio) improves, the arrows may converge to approximately the size of the target. The user may then be able to fire the weapon, or wait for a better condition to get the first round hit.

Laser System

Figure 3:
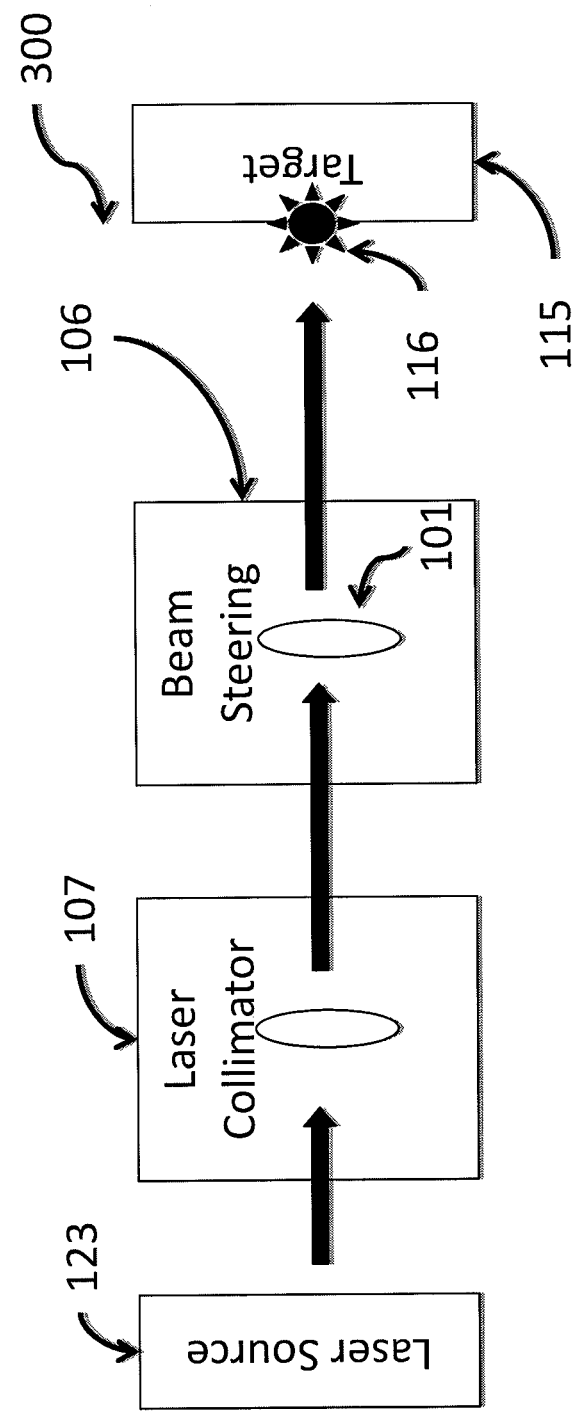
FIG. 3 is a block diagram of components of a laser system implemented in an electro-optic system for measuring crosswind, according to an exemplary embodiment of the present invention.

FIG. 3 shows the components of the laser system 300 consisting of suitable laser diode 123, collimation optics 107 and, in some implementations, a laser beam steering assembly 106 to redirect the beam useful for boresighting when the XWS is used along with an existing riflescope. The wavelength of laser selected may be limited to the visible band to prevent the system from being used by terrorists in combat situations. Visible wavelength of the laser deters terrorists for using such system in combat situations where it can be easily detected. In an exemplary embodiment, the wavelength of the laser diode 123 selected is 638 nm which also allows use of a low cost CMOS image sensor as the signal detector(s) (113 in FIG. 5, 119 in FIG. 6) for the wind measurement channels 500, 600. Other blue or green wavelengths can also be used if low cost laser diodes with average output power greater than 170 milli-watts are available. The light source selected is a single-mode pseudo coherent diode laser 123 which is low cost, efficient, readily available, and has a very short coherence length, approximately 400 microns. High coherence light, with coherence length greater than a couple of centimeters, produces speckles at the collection receiver when it reflects from a rough surface (>500 microns rms). Speckles are produced due to light interference caused by the surface roughness which minutely changes the path length of the various returning beams at the receiver. The laser speckle pattern looks similar to the spatially varying intensity pattern caused by atmospheric turbulence. The speckles however, do not move with the wind but introduce noise in the time varying wind signal. Various methods may be used for reducing the speckle contrast and the resultant noise level, including, but not limited to the following. One technique is splitting the laser beam among multiple beams whose path lengths to the target differ by more than the coherence length of the laser. This results in speckle patterns for the various beams that are uncorrelated. Addition of the uncorrelated speckle patterns yields a reduction of the speckle contrast. An alternate technique is to split the laser beam between two beams with orthogonal polarizations. This results in two uncorrelated speckle patterns that when added together reduces the contrast. Another approach employs wavelength chirp to widen the spectral width. When laser diodes are pulsed, the wavelength of excitation frequency changes by more than 100 GHz over a 200 ns pulse-width. When semi-conductor laser diode sources are frequency swept at these rates, the laser coherence length is reduced (spectral line width is increased) which reduces the speckle contrast. Whatever method is used to reduce the coherence length, it is preferred that the coherence length be less than a surface roughness associated with the target. For example if the spectral line width is 4 to 8 nm, the coherence length is $=(6.38\text{ e}{-}7)^2/8\text{ e}{-}9 = 51$ μm which is generally less than the rms (root mean square) of surface roughness of a target (typically on the order of 500 microns).

The laser diode 123 has a wavelength of 638 nm and typically a 28 mm diameter lens accepts the diverging radiation from the diode 123 which is then collimated to a 50 micro radian beam. To maximize light collection and to produce diffraction limited beam divergence, careful selection of the lens focal length provides optimized performance. Once collimated according to the optics in laser collimator 107, the laser beam is propagated through a beam steering module 106 to align it with the imaging optics, weapon bore or riflescope crosshair. In an exemplary embodiment, the laser system 300 operates in three modes: low light level imaging, ranging and wind measurement. All the modes are accessible to the user via switches on the system housing 1000.

A beam steering module 106 may be used in the collimated laser path to allow precision alignment of the laser beam in two orthogonal directions with the imaging optics of an existing riflescope mounted to the weapon. In an exemplary embodiment, the steering module 106 is a set of Risley prisms which provides better than 50 micro radian angular alignment resolution and stability from shock, vibration and temperature changes in retaining the alignment of the laser beam over long periods. The robustness of this approach stems from the fact that the Risley prisms provide a mechanical compression in the angular steering of the laser beam. For example, if two counter-rotating Risley prisms are mechanically rotated by 180 degrees, the laser beam may be moved linearly, only a degree, in one direction providing a compression of 180 times. To make the laser alignment user friendly, the design requires moving the laser beam linearly in the azimuth or elevation direction independently so that the desired position of the beam in angular space is achieved rapidly. To achieve this functionality, two sets of counter rotating Risley prisms are mechanically configured so that they may be rotated by two independent set of knobs (illustrated by reference numbers 108, 109 in FIG. 8). In an alternate embodiment, a piezoelectric driver can also be used to move the laser diode in azimuth or elevation relative to the collimating lens producing similar beam alignment. In another embodiment, a micrometer mechanical stage could be used to move the collimated laser beam assembly in the azimuth and elevation. The major disadvantage of both these approaches is that they are extremely sensitive to shock and vibrations causing large changes in the beam alignment over time.

In an exemplary embodiment, an electronic crosshair may be generated in the XWS 100 for aiming the system on the target. Looking at a target using the crosshair in the view finder, the angular misalignment offset between the rifle bore and the system's laser aim point (i.e., the system line of sight (LOS)) may be determined Because the ballistic offset aim point calculated using the wind and range measurements is independent of the system LOS, factory calibration of the XWS and rifle zeroing can yield the required offset without moving the laser beam using a steering device. This will be described in more detail in connection with weapon and system alignments below.

Optical Receivers

According to an exemplary embodiment, the XWS 100 includes three optical receiver channels 400, 500, and 600.

Figure 4:
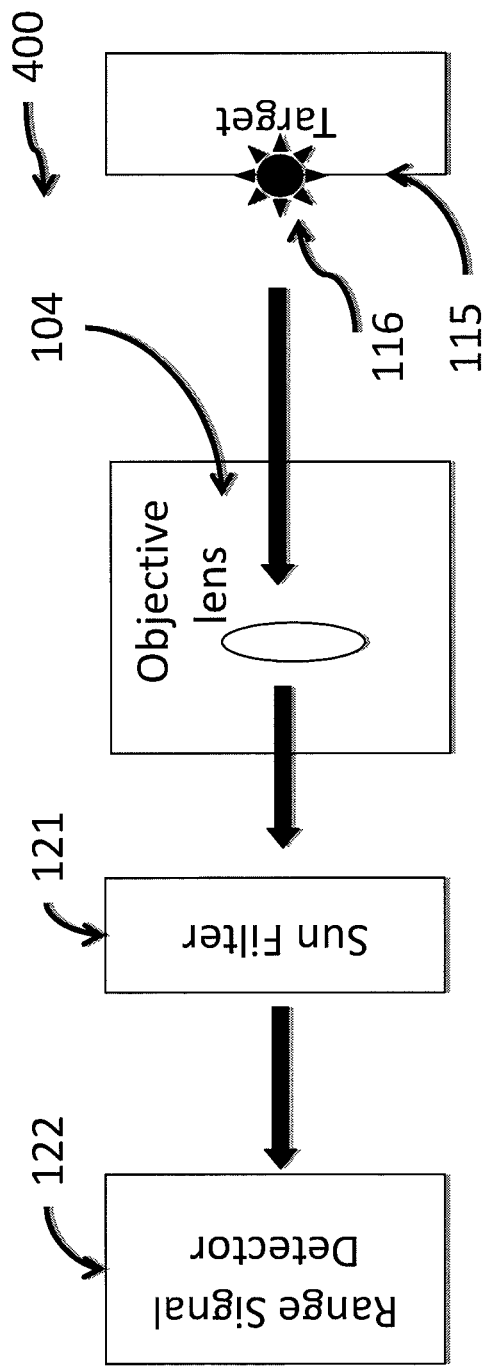
FIG. 4 is a block diagram of components of a ranging receiver implemented in an electro-optic system for measuring crosswind, according to an exemplary embodiment of the present invention.
Figure 5:
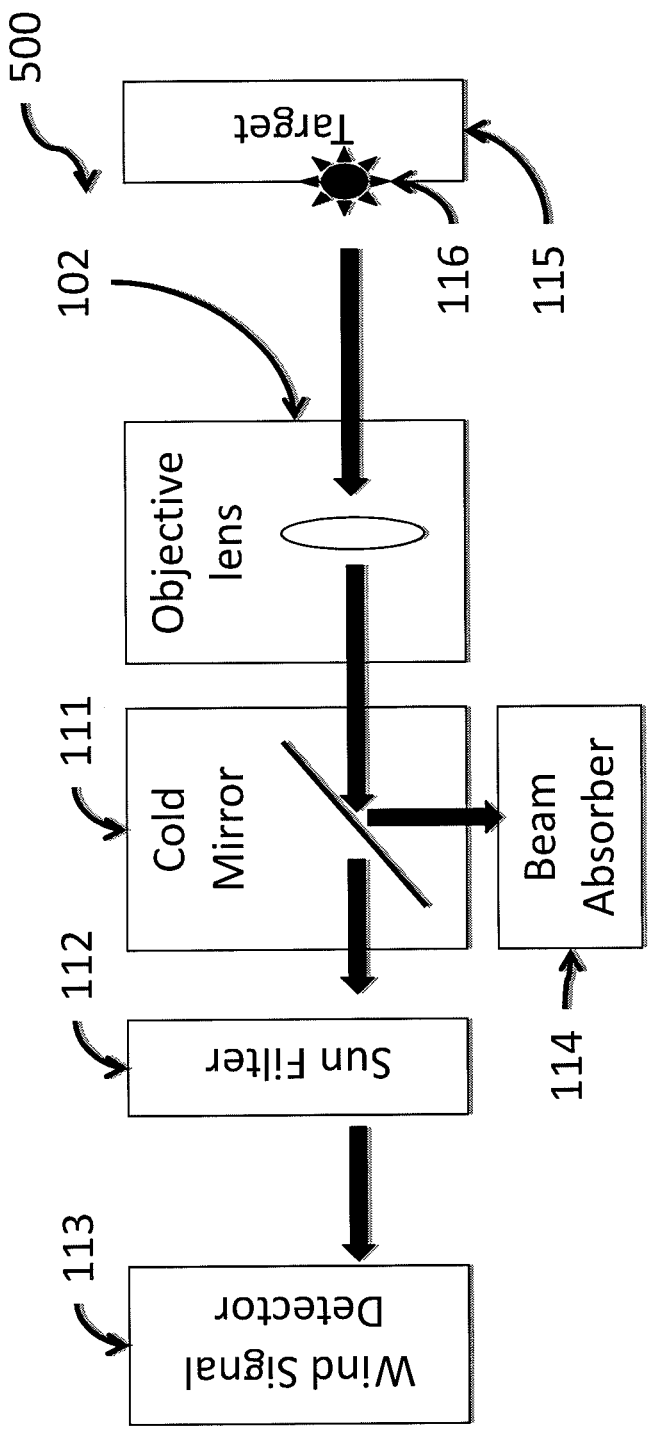
FIG. 5 and FIG. 6 are block diagrams of respective wind measurement channels implemented in an electro-optic system for measuring crosswind, according to an exemplary embodiment of the present invention.
Figure 6:
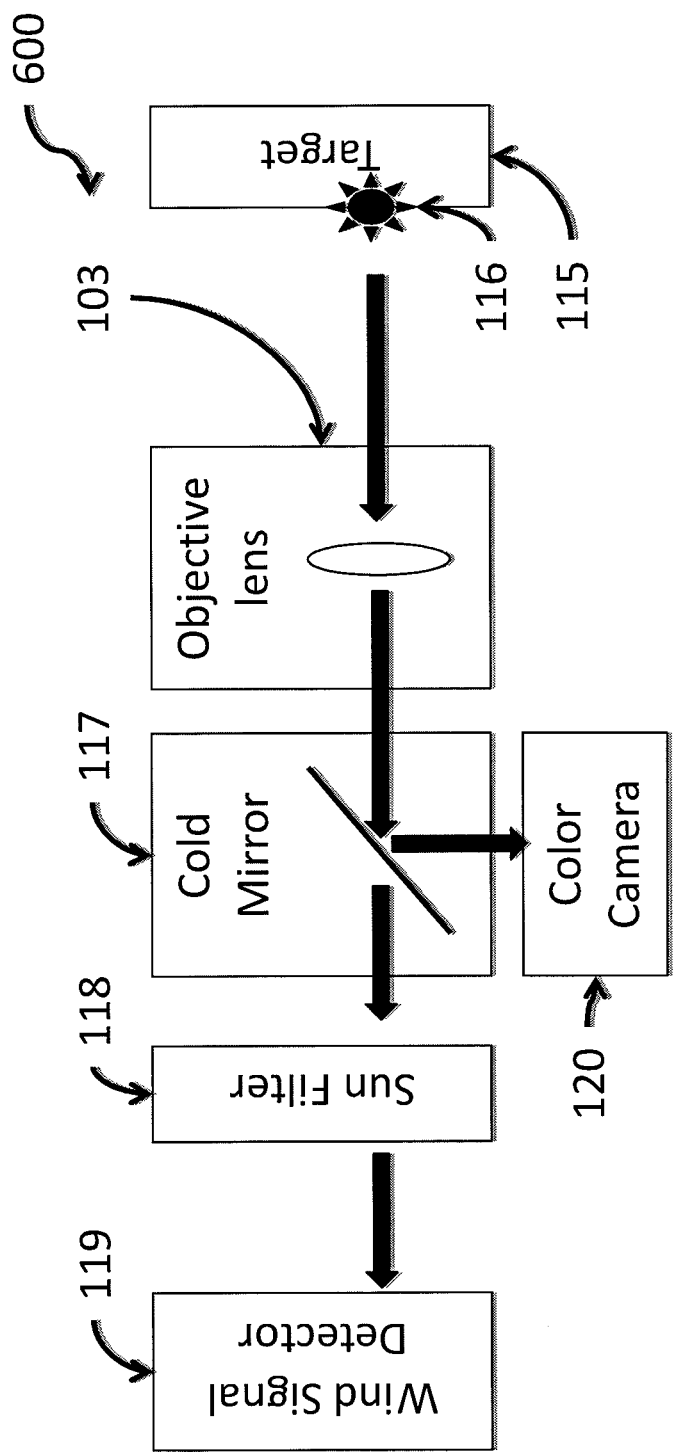

The components of each of these channels 400, 500, and 600 are shown in FIG. 4, FIG. 5, and FIG. 6, respectively. As discussed above, two of these optical channels 500 and 600 are wind measurement channels configured for receiving the reflected signal from the target to measure wind (and receiving image signals of the area surrounding the target for imaging). As such, the third channel 400 may be used for ranging measurements.

Ranging:

In an exemplary embodiment, a separate aperture 104 is used with a lens that focuses the received narrow ranging pulses with a width of up to 70 ns onto 3 to 10 MHz bandwidth silicon APD (avalanche photodiode) receiver 122. In alternate embodiment, one of the wind measurement apertures 102, 103 could be used for ranging by inserting a beam splitter but this has the penalty of losing a part of the wind signal. The light passes thru a narrow band-pass filter to exclude background sunlight minimizing the shot noise generated while maximizing the signal to noise ratio. Range is determined by conventional round trip time of flight measurement known to those familiar in the art. Range accuracy is improved by both averaging multiple single pulses in flight to improve SNR and by interpolating the received signal pulse using for example a 200 MHz clock to yield a total range uncertainty of ~1.5 meters.

During ranging, the laser 123 is rapidly pulsed at a high peak power for periods up to a second. The returns from the outgoing pulses are timed to give the range as is practiced commonly in laser rangefinders. To improve the SNR the returns from multiple pulses are averaged. The averaging time varies with range and conditions. The ranging process is automatically terminated once a result with an SNR sufficient to assure required accuracy has been achieved. For example, the laser can be pulsed with a peak power of 300 mw, pulse width 70 nsec, and 125 kHz repetition rate. Using multiple-pulse averaging the link budget closes out to 1000 meter with an averaging time of approximately 500 milliseconds. The time reduces to less than 1 millisecond for a 200 meter range. Once the range is determined with the desired accuracy (see operation 3202 of FIG. 12, which will be discussed in more detail below) the range can be displayed to the user (e.g., as part of indicator 5003 in FIG. 19), and the laser is automatically shifted to the wind measurement mode (see operation 3300 of FIG. 11, which will be discussed in more detail below). In an alternate embodiment, the range measured by other techniques can be manually input into the system.

Wind Measurement Channels:

FIG. 5 and FIG. 6 show the components of the two wind measurement channels. In the wind measurement mode the laser output is a constant continuous power and the laser return from the target is detected by the wind receiver channels. Two 35 mm lenses 102, 103 separated by a fixed horizontal distance (e.g., ~50 mm) gather the light for wind measurement and focus it onto a corresponding pair of CMOS image sensors 113, 119. The image sensors can be read out at rates up to and greater than 1000 frames/sec to insure capture of the frequency content of the atmospheric scintillation dynamics. The signals used for the wind measurement covariance calculations are derived by summing the outputs of all the pixels in a small area surrounding each laser spot 116. An alternative embodiment employs a series of mirrors to direct the images of the laser spot from both apertures onto different areas of a single CMOS image sensor. In another alternative embodiment the CMOS image sensors are replaced by silicon APDs or PIN photodiodes. For each of the aforementioned embodiments, the background sunlight may be filtered out by band-pass filters 112, 118 (e.g., 10 nm bandwidth) to accommodate acceptance angle and change in wavelength of the source over temperature. Cold mirrors 111, 117 are used in the receiver optical path to pass the laser wavelength to the image sensors but reflect the rest of the visible spectrum onto a color 120 or black and white digital camera for target imaging.

As described earlier, any of the four different covariance processing techniques described in described in Wang et al., ("Wind measurement by the temporal cross-correlation of the optical scintillations," *Applied Optics V*20, No. 23, December 1981, the entire contents of which are herein incorporated by reference), may be used to provide a path-weighted average value of the wind. In each of these techniques, the weighting function is dependent on: the laser beam divergence and separation between the two receive apertures, the wavelength of the laser light and the range. When the size of the laser spot (beam divergence) is much greater than the lens separation the weighting function peaks close to the shooters end of the path and has little sensitivity at the far end. If the size of the laser spot is significantly smaller than the lens separation, the sensitivity of the weighting function peaks near the target end. Proper choice of the system parameters provides a weighting function for the wind measurement that approximately matches the ballistic influence function of the bullet.

In some situations, when the winds are uniform along the path, the average of a single weighting function is adequate to provide accurate results. In other situations, when the winds are not uniform due to non-uniform terrain, buildings, trees, or hills that block or channel the wind, the accuracy of the single weighting function approach is somewhat degraded. Accuracy in the non-uniform wind case can be improved by making measurements with multiple different weighting functions, and combining the results.

Figure 15:
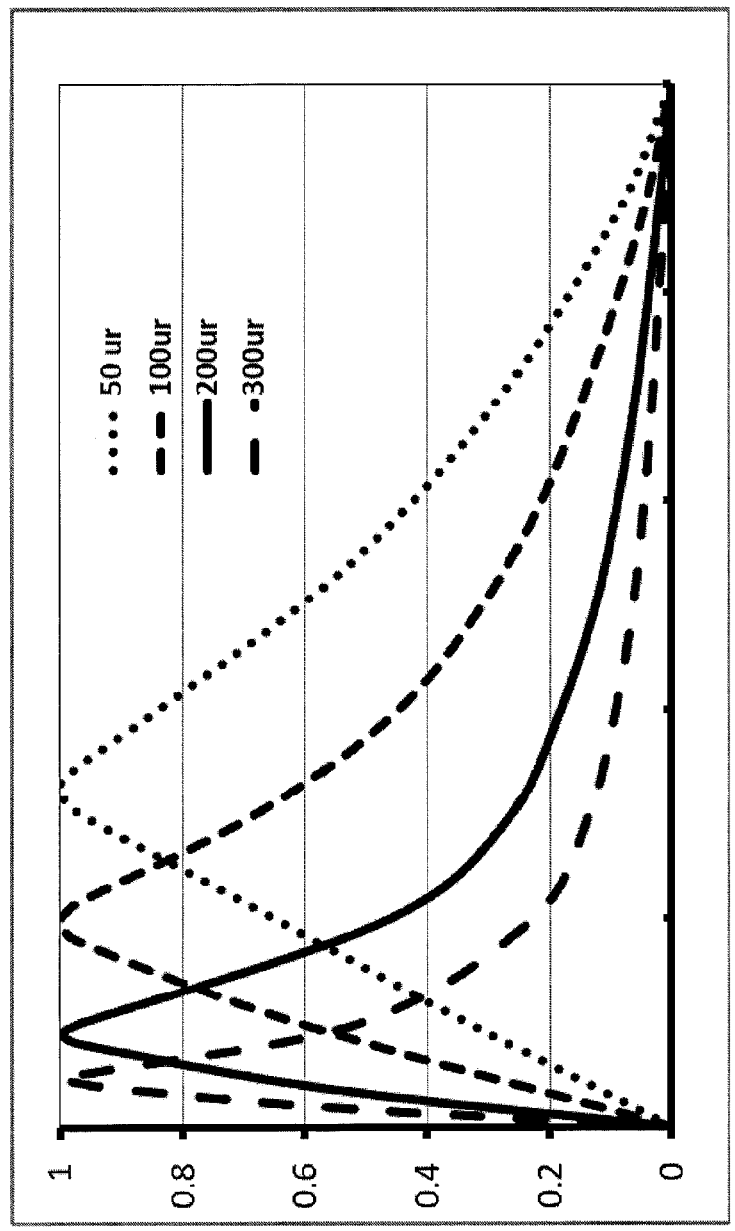
FIG. 15 shows examples of four different weighting functions, which are produced by varying the laser divergence, for use by a processor in determining and combining multiple path-weighted average crosswinds according to an exemplary embodiment.

The different weighting functions can be generated by changing the separation between the two receiver lenses 102, 103, or by changing the laser divergence to change the spot size of the laser, or else by analyzing the angular profile of the laser spot size. Changing the separation of the receivers during wind measurement of about 1 sec is considered impractical. However, the other two approaches are practical with each having their own limitations. The change in laser beam divergence can be achieved by using multiple fixed divergence beams (which requires additional light sources, thus impacting costs) or with a piezo driven positioner on the collimator axis of a single laser source. FIG. 15 shows the contribution to wind measurement from four different weighting functions which are produced by varying the laser divergence from 50 to 500 μrad. Although FIG. 15 shows four different weighting functions, it will be readily understood that by increasing the number of weighting functions, the crosswind profile resolution can be improved.

Figure 16:
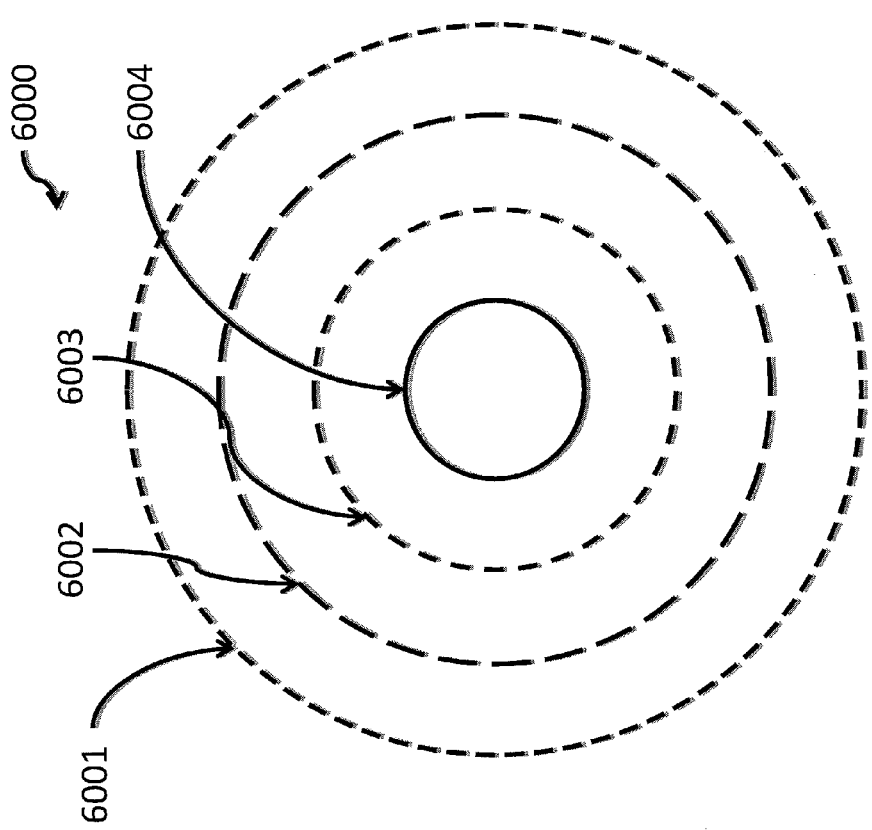
FIG. 16 shows examples of four different weighting functions, which are derived from image data by software, for use by a processor in determining and combining multiple path-weighted average crosswinds according to an exemplary embodiment.

In another embodiment, instead of varying the laser beam divergence, it may be easier to analyze the angular profile of the spot size in the image plane of the camera using software instead of adding hardware. The laser spot is imaged onto the image sensor of the camera and spans several pixels. The outputs of all the illuminated pixels are summed to get the signal for chosen beam divergence. As shown in FIG. 16, the signals corresponding to different beam divergences can be derived from the single image data by sequentially summing the pixels in different areas of the image. For example, the areas 6001, 6002, 6003, 6004 in FIG. 16 could all be processed as different divergences. Thus, multiple "effective" spot sizes can be extracted from data collected simultaneously. Summing all pixels within the largest circle 6001 corresponds to a spot size of 100 μrad (micro-radians), all within the next smaller circle 6002 correspond to spot size 80 μrad, next smaller 6003 is 40 μrad and smallest 6004 is 20 μrad.

Target Imaging:

In the embodiment illustrated in FIG. 5 and FIG. 6, in one wind measurement channel 600 the cold mirror 117 reflects the light onto a high resolution image sensor 120, and in the other wind measurement channel 500 the light is directed to an absorbing surface 114. In an exemplary stand-alone embodiment, the XWS 100 is used without riflescope thus eliminating the associated cost. The color camera 120 runs at normal video rates (15 to 60 Hz) and provides the user a view of the target and the surrounding area comparable to that seen with a conventional riflescope. The output image is viewed on a high resolution micro-display 1100. The micro-display 1100 is viewed through an eyepiece glass 105 located where the conventional riflescope eyepiece would otherwise be, providing an eye relief ranging from 2 to 4 inches adequate to prevent injury to the user 207 eye from gun recoil. FIG. 8 shows an external view of an embodiment of the XWS 100 which can be mounted directly to the rifle.

The image resolution that can be provided by the "digital scope" is comparable to that of existing riflescopes because both are limited by the diffraction from the aperture size. Assuming a 35 mm riflescope and 35 mm apertures for the XWS both will have a 38 μrad resolution limit at 550 nm wavelength. Assuming for an example that the camera sensor 120 is an Aptina™ AR1411HS with a 4620×3084 pixel array and a 2.86 μm pixel pitch, and the receiver lens is 35 mm diameter with a 100 mm focal length; the pixel IFOV (instantaneous field of view) will be 28.6 μrad. This is less than the 38 μrad diffraction-limited resolution. The system will therefore be aperture diffraction limited rather than pixel limited providing a smooth image without pixel grains.

If the entire pixel array is displayed to the user 207, the FOV (field of view) would be 7.6×5.1 degrees. If instead, the image displayed to the user is circular to emulate the view normally seen through a riflescope, the FOV may be 5.1 degrees in diameter. This FOV can be used for searching a target. For closer inspection and aiming at the target, a push-button switch can be activated to apply digital zoom in a series of steps.

Nighttime imaging without the use of an image intensifier night-vision device is made possible by a clip-on holographic diffuser, which may be disposed in the path of collimated laser beam 130 (FIG. 2), to provide dual divergence of 44 milli-radians for illumination while retaining the original central divergence of 50 μrad. The illumination beam is very useful in finding the target, whereas the narrow spot beam verifies that the system is aligned and that the beam is on the target when a measurement is initiated. In this mode, the laser energy per frame increases due to lower camera frame rate, and the camera is set to bin pixels. Link budget calculations show that even with no moonlight, images with SNR>10 dB can be achieved out to a range of 200 meters. To achieve this, the following parameters may be required: laser power of 170 mw, beam divergence of 2.5 degrees, 4×4 pixel binning, and a camera frame rate of 15 frames/sec. The 2.5 degrees beam divergence becomes the FOV of the useable image, 8.7 meters in diameter at a range of 200 m.

Electro-Optic Design

In summary, the electro-optic system, which is configured in an exemplary embodiment of the invention to measure path-integrated crosswinds, uses at least two apertures 102 and 103 to collect the laser light 116 scattered back from the target 115 onto the digital wind detectors 113, 119. In an exemplary embodiment, the digital wind detector 113, 119 is a CMOS camera. Camera pixels illuminated by the laser spot 116 are summed into a single measurement (see operation 3307 of FIG. 12) that changes with time and moves from one aperture to the other with the crosswind. By measuring the covariance of the two received signals, the path-averaged crosswind is calculated using the cross-covariance processing technique. The two aperture approach is more robust than the single aperture approach because it does not require resolving the light and dark features on the target, and is unaffected by the atmospheric turbulence noise on the outbound path and is insensitive to scintillation index changes since the entire laser spot is summed into a single signal.

In an exemplary embodiment, the electro-optic system is designed to measure range and crosswind up to 1000 meters. This requires a laser 123 with CW power of 170 milli-watt at 638 nm laser wavelength with beam divergence=50 μrad produced by a 28 mm collimating lens and the reflected light collected by a 35 mm receiver lens (same as a commonly used in deer hunting riflescope) with a camera frame rate up to 1000 Hz and noise floor 25 e/pixel/frame. This design is optimized by conducting round trip optical power budget analysis for required signal noise ratio of 10 dB while also optimizing the weighting functions along the path to closely match the influence function of the projectile. Other laser wavelengths in the visible or near invisible (Infrared/IR) range could also be used but the design would be somewhat different. For ranging, the same laser provides a peak power of 300 milli-watt at 70 ns pulses that may be repeated at 125 kHz to ensure a single pulse in flight to the target and back. The returned signal is collected with a 15 mm aperture lens that focuses the signal on a 0.5 mm APD receiver with a bandwidth of 3 to 10 MHz. The system parameters for both ranging and wind measurement modes in the preferred embodiment, are shown below in Table 1.

TABLE 1

System Parameters to Close Link Budget at 1000 m Range

| Parameter (units) | Ranging | Wind Measurement |
|---|---|---|
| Range to Target (m) | 1000 | 1000 |
| Laser Peak Power (w) | 0.3 | 0.17 |
| Wavelength (nm) | 638 | 638 |
| Beam Divergence (gad) | 50 | 50 |
| Waist Diameter (m) | 0.028 | 0.028 |
| Pulse Duration (sec) | $7 \times 10^{-8}$ | CW |
| Pulse Repetition Rate (kHz) | 125 | NA |
| Receiver Aperture (mm) | 15 | 35 |
| Camera Frame Rate (Hz) | NA | 750 |
| Duty cycle | $8.75 \times 10^{-3}$ | 1 |
| Energy/Pulse (J) | $2.1 \times 10^{-8}$ | NA |
| Signal Averaging Time (sec) | 0.30 | 0.002 |
| Energy/Frame (J) | NA | $4.0 \times 10^{-4}$ |
| Receiver Noise Floor (dBm) @ 3 MHz | −77.9 | NA |
| CMOS Camera noise floor (e) | NA | 25 |

Digital Riflescope Design

Figure 7:
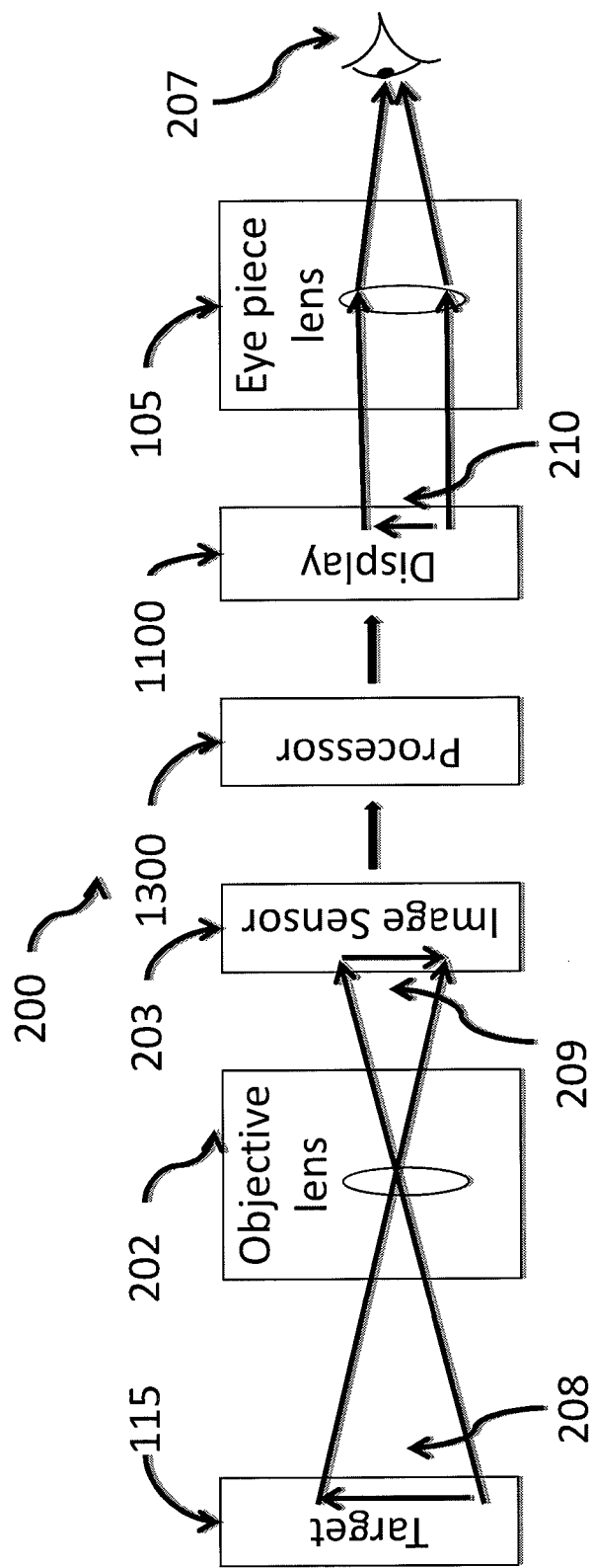
FIG. 7 is a block diagram of a digital riflescope utilizing principles of the present invention, according to an exemplary embodiment.

The objective in an exemplary embodiment of the invention is to replace the conventional riflescope with a system that provides automatic compensation for wind and range errors while providing optical performance that matches or exceeds that of conventional riflescopes. Accordingly, an exemplary embodiment of the present invention, the XWS 100 can be implemented as a "digital riflescope" or "digital scope," providing the user with a micro-display 1100 for viewing the target 115 and surrounding area (e.g., with the determined OAP and other calculated parameters overlaid). FIG. 7 is a block diagram illustrating the components of the XWS 100 arranged as a digital scope 200.

Diffraction sets an ultimate limit to optical performance of conventional riflescopes. Diffraction limited resolution is inversely proportional to aperture size so resolution improves with the size of the aperture. In view of this, we compare the performance of a XWS-based "digital riflescope" 200, designed in accordance with principles of the present invention, to a conventional riflescope with the same aperture size. A series of products with varying performance can be fielded to compete with the range of conventional scopes currently available. For our comparison, we assume an aperture size of 35 mm. The diffraction limited resolution for a 35 mm aperture is 38 μrad which becomes the effective resolution of both the riflescope and the XWS-based digital riflescope 200. Other performance parameters are FOV and magnification. For a typical 35 mm riflescope the magnification zooms from 2.6× to 7.8× with corresponding FOV from 7.2 to 2.6 deg.

Components of the digital scope 200 shown in FIG. 7 will now be described. An objective lens 202 focuses the image onto an image sensor 203. The output of the image sensor is read by a signal processor 1300 (as described above in connection with FIG. 2) and electronically displayed on a micro-display 1100 (also described above in connection with FIG. 2), which is viewed by the user through a magnifying eyepiece 105 (as shown in FIG. 2). According to an exemplary embodiment, the objective lens 202 and image sensor 203 may be implemented as part of an image-capturing channel separate in addition to the wind measurement channels 500 and 600 (not shown in FIG. 7). Alternatively, it is possible for these elements to be shared with one of the wind measurement channels, such as channel 600. For instance, the objective lens 202 of FIG. 7 may refer to the same objective lens 103 utilized by the wind measurement channel 600, as illustrated in FIG. 2 and FIG. 6. Also the image sensor 203 of FIG. 7 may correspond to the same image sensor 120 used in the wind measurement channel 600, as illustrated in FIG. 2 and FIG. 6.

Table 2, provided below, shows the calculated performance parameters of a XWS-based digital riflescope 200 designed to replace a 35 mm riflescope. The key parameters to achieve images indistinguishable from those seen through a conventional riflescope are number of pixels and the pixel pitch of both the image sensor and the micro-display. The parameters used in Table 2 list the state of the art image sensor and micro-display. For both components the performance will improve with time while the cost declines.

TABLE 2

| Objective Lens | Diameter | D (m) | 0.035 |
|---|---|---|---|
| | Focal Length | F (m) | 0.1 |
| | f# | | 2.8 |
| | Diffraction Limit | (μrad) | 38 |
| Image Sensor | # Pixels | | 4620 × 3084 |
| Aptina ™ AR1411HS | Pixel Pitch | x (μm) | 2.86 |
| | IFOV (urad) | | 28.6 |
| | Total FOV | (rad) | 0.13H × 0.088V |
| | Total FOV | (deg.) | 7.6 × 5.1V |
| Micro-display | # color pixels | | 1920 × 1200 |
| eMagin ® EMA-100820 | Pixel pitch | (μm) | 9.6 |
| | Display Width | (mm) | 18.4 |
| Eyepiece | Magnification | | 5X |
| | Eye Relief | (mm) | 100 |
| System Circular FOV | At Mag = 3.7x | (deg.) | 5.1 |
| | At Mag = 18.5x | (deg.) | 1.0 |

The display assembly consists of an eyepiece 105 through which the hunter views a high resolution micro-display 1100. The micro-display 1100 is driven by the processor 1300 and provides a digital image of the target 115 and surrounding area. During wind measurement, the laser spot 116 is also shown. FIG. 19 illustrates the view of the target area as seen through the micro-display 1100 according to an exemplary embodiment of the present invention. As shown in this figure, the image of the target 115 and laser spot 116 may be overlaid with a reticle 5001 (crosshair) and an offset aim point 5007 showing the corrections required to compensate for wind and range. The overlay information may include any combination of the offset aim point 5007, confidence metric 5004, 5005, a collection of reference marks 5009 that assist angular measurement relative to the offset aim point 5007, and moving target lead marks 5008, that assist in aiming at moving target. The image that is displayed may be produced by the wind measurement channel 600 of FIG. 6. An alternative to the eyepiece viewing, it would be possible to mount a larger direct-view digital screen, such as used in camera-phones. However, the eyepiece display has the advantage of closely mimicking the way users have learned to shoot with a riflescope. Other information such as the range 5003 to the target can also be displayed. The magnification of the image can be selected by the user through a single pushbutton that steps the digital electronic zoom thru a series of values.

Controller Processor

The signal processor 1300 is the central control for the XWS 100. It may receive commands from the user via a series of pushbutton switches 1000. It may provide the switching between imaging and wind measurement, the digital zoom, control of the laser current required for either ranging, illumination, or wind measurement, collects and stores information on all parameters needed for the ballistic calculations, acquires the image, wind, and range measurement data, and met data, analyzes the data to determine range and crosswind, displays the image and range, and the aim point offsets.

Figure 11:
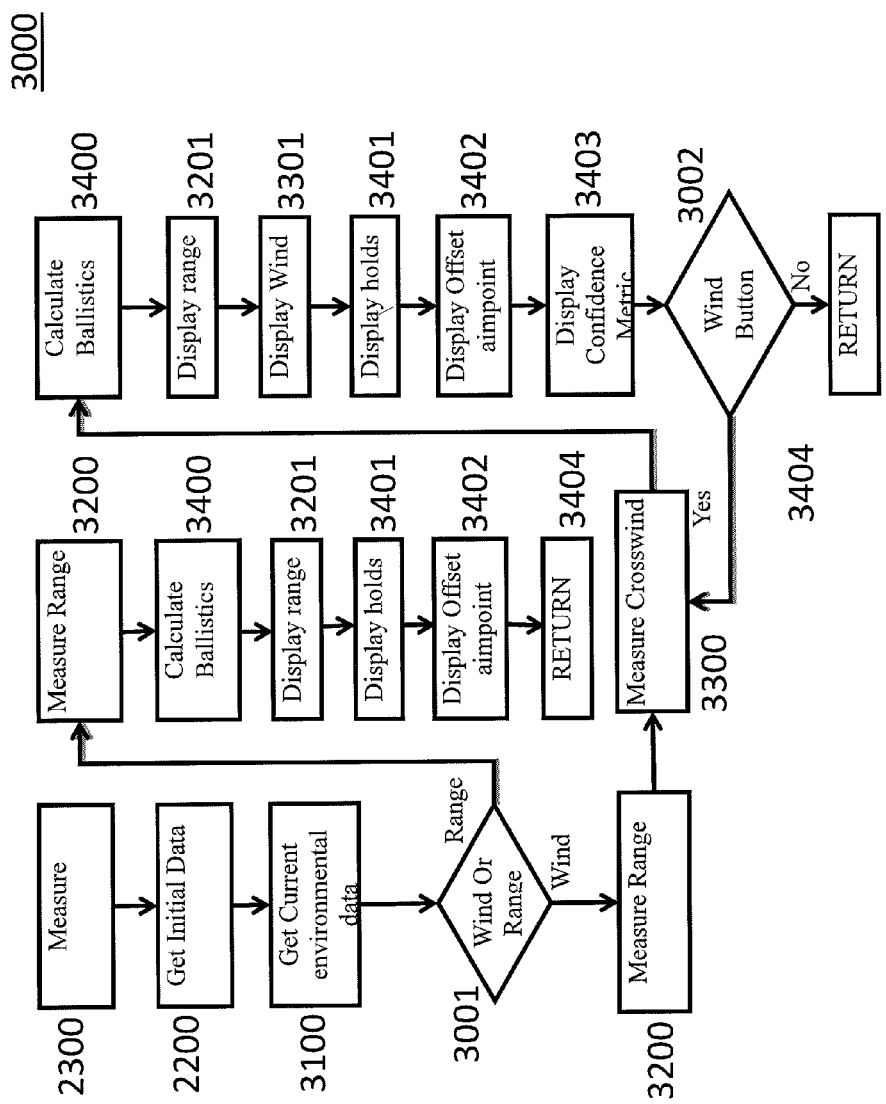
FIG. 11 is a flowchart illustrating an algorithm for performing a sequence of measurements using an electro-optic system for measuring crosswind, according to an exemplary embodiment of the present invention.

In an exemplary embodiment, when the system 100 is operated without the riflescope, the digital camera provides imaging at video rates for use in target acquisition. FIG. 11 is a flowchart illustrating an algorithm for performing a sequence of measurements 3000, and displaying the results thereof, according to an exemplary embodiment. Once a target is located, the user can press a button 1000 to initiate a measurement sequence (2300). After some initial data collection steps (2200 and 3100), a decision is made as to whether a ranging measurement or crosswind measurement is selected in 3001. If a range mode measurement is selected in 3001, then the XWS 100 measures the range in 3200 and displays the range in 3201. If, on the other hand, the wind mode is selected in 3001, then the system 100 automatically measures the range to the target in 3200, and then shifts into the wind measurement mode which commences in 3300. The image sensors 113, 119 used for wind measurement are operated in a high frame rate windowed mode where only a small area of pixels surrounding the laser spot is read-out. The image sensors 113, 119 are synchronized so that there is no time delay error introduced into each of the two output signals.

Figure 12:
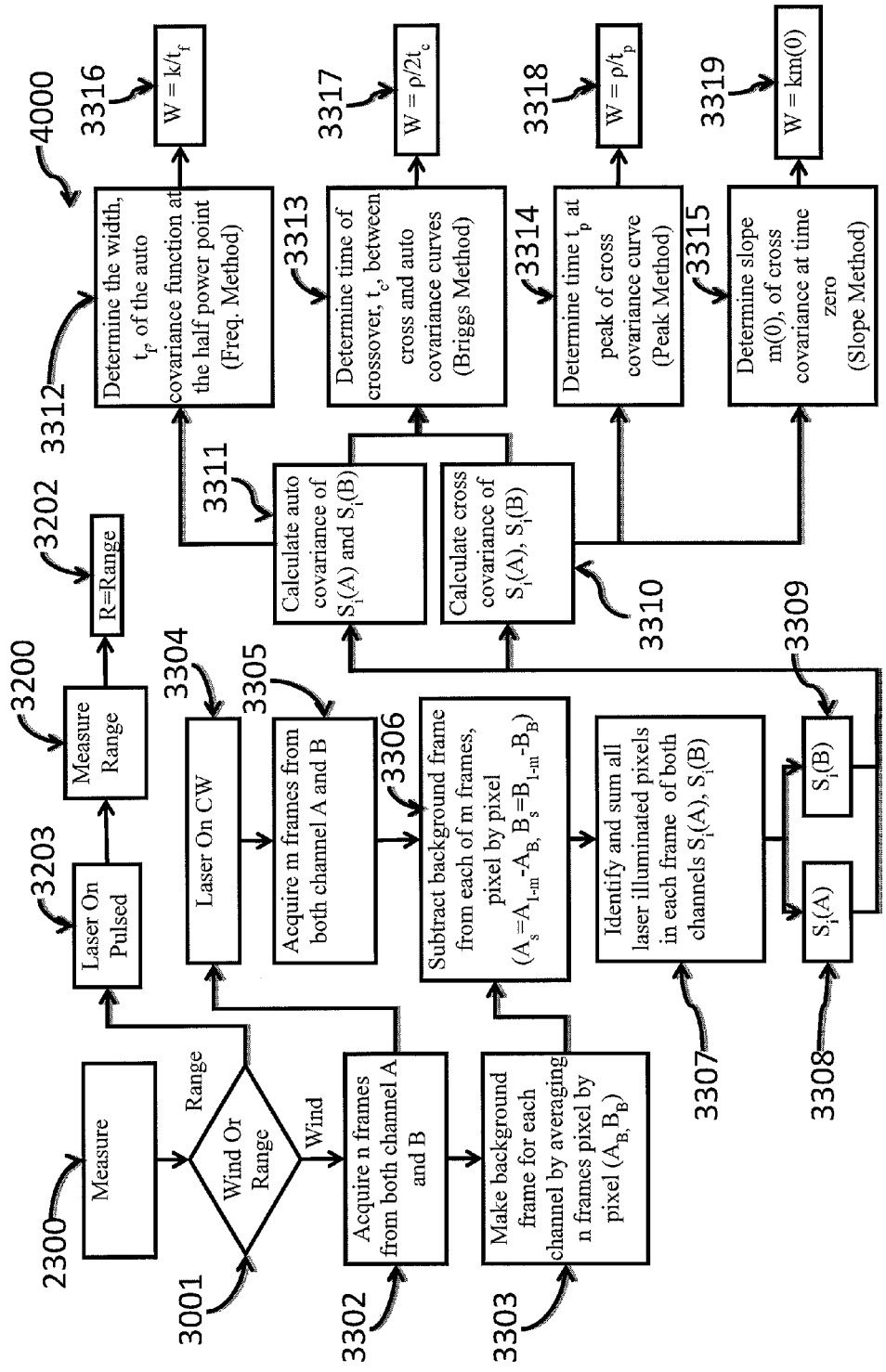
FIG. 12 is a flowchart illustrating an algorithm for obtaining a single measurement of a path-weighted averaged crosswind, according to an exemplary embodiment of the present invention.

Wind Algorithms:

FIG. 12 is a flowchart of the algorithm for obtaining one or more measurements, but focusing on particular operations for obtaining a single measurement of the crosswind, according to an exemplary embodiment. As discussed above, the optical receiver for wind measurement consists of two channels 500 and 600, each having a collection lens 102, 103 and connected to respective image sensor detectors 113, 119 (or possibly the same image sensor detector). In each of these wind measurement channels 500 and 600, the lens 102, 103 focuses the laser spot onto a small area of the image sensor. A single wind measurement involves capturing the time history of each channels signal for a fixed time, tw. As described above signal processing methods based on a cross-covariance technique have been demonstrated capable of extracting the crosswind speed from the temporal behavior of the two signals detected by the respective wind measurement channels 500 and 600. Wang et al., ("Wind measurement by the temporal cross-correlation of the optical scintillations," *Applied Optics* V20, No. 23, December 1981, the entire contents of which are herein incorporated by reference) compared the strengths and weaknesses of several different approaches. The peak shifting approach as described in Wang et al. has been found to be advantageous under various circumstances, but any of the other techniques described in Wang et al. could also be implemented in such manner as to provide similar results.

Figure 17:
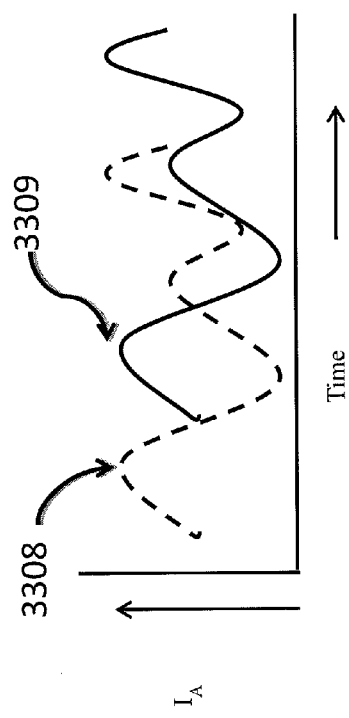
FIG. 17 illustrates examples of respective signals arriving at first and second wind measurement channels with a time difference, according to an exemplary embodiment of the present invention.

FIG. 17 illustrates examples of respective signals 3308, 3309 which are detected, at different times, via the first and second wind measurement channels. In this figure, the two signals 3308 and 3309 are shown as exactly the same except for the time difference or delay. However, in practice, the correlation between the two signals gradually decays with time. This decay is the source of errors that result in differences in accuracy of the different signal processing approaches. Regardless of which cross-covariance processing approach is employed, the wind is determined from the time varying signals that are proportional to the total signal collected by the respective apertures 102, 103.

Referring again to FIG. 12, a description of the algorithm described therein will now be provided. It is noted that, in FIG. 12, for purposes of convenience, the wind measurement channel 500 is referred to as channel A, while wind measurement channel 600 is referred to as channel B (this is consistent with FIG. 2 which refers to channel 500 as corresponding to "Imager A" and channel 600 as corresponding to "Imager B"). The measurement sequence of FIG. 12 begins at 2300 where the user requests a measurement of either range or wind (e.g., via push button 1000). If the request is to measure range, processing may proceed to the sequence of 3203, 3200, and 3202 in order to measure and display the range. If instead the request is for wind measurement in 3001 of FIG. 12, the processor 1300 proceeds to measure crosswind. However, even if 3001 decides to perform the crosswind measurement, the first action may still automatically be to measure the range in 3200 and then display the measured range in 3201, as illustrated in FIG. 11. In 3302, the image sensors for both wind measurement channels acquire a small number of frames (nominally 10) with the laser off. The laser is then turned on in 3304 in the CW (continuous wave) mode to acquire data for the wind measurement. With the laser on, both channels 500(A) and 600(B) acquire a large number m (≈300) of frames in 3305. The n background frames are then averaged, pixel by pixel, to yield an average background frame for each channel in 3303. Accordingly, in 3306, the average background frame obtained in 3303 for wind measurement channel 500(A) is subtracted from each of the m frames acquired by the same channel 500(A) with the laser on. Similarly, in 3306, the average background frame obtained in 3303 for wind measurement channel 600(B) is likewise subtracted from the frames detected by channel 600 (B) in 3305 (i.e., with the laser on). Thereafter, the processor 1300 identifies the location of the laser spot image for each of channels 500(A) and 600(B), and sums the signal from all of the pixels that are illuminated by the laser spot for each of these channels in 3307. This yields the two time-series signals $S_i(A)$ and $S_i(B)$ in 3308 and 3309, respectively, where i indicates the frame number which is proportional to time. The cross-covariance function of these time-series signals $S_i(A)$ and $S_i(B)$ is calculated in 3310, and an auto-covariance function of these signals $S_i(A)$ and $S_i(B)$ is calculated in 3311. At this point, FIG. 12 illustrates that there are four possible techniques (each corresponding to one of 3312, 3313, 3314, and 3315) that can be selected for determining the crosswind, each corresponding to a particular cross-covariance technique as described in the Wang et al. article. However, it should be noted that the inclusion of four different techniques in FIG. 12 (as indicated by the branching-off of 3312, 3313, 3314, and 3315) is not intended to convey that the processor 1300 is capable of performing four different techniques. Instead, techniques 3312, 3313, 3314, and 3315 in FIG. 12 are merely intended to show that the principles of the present invention can be implemented using any of the four techniques, or any other technique that is similarly capable of processing the detection results of channels.

One particular embodiment may use the peak shifting method of 3314 and 3318. This approach determine a time delay tp at which the covariance function has its peak value in 3314, and then determines the crosswind speed W in 3318. This is done by dividing the value of the horizontal separation ρ between the two channels 500(A) and 600(B) by the peak delay time tp.

As an alternative to the peak shifting technique, a slope method may be employed. If this technique is employed, the value of the covariance function slope at a time delay of zero is determined in 3315, and used in 3319 to calculate the crosswind speed W from the expression W=k multiplied by the slope at zero, where k is an instrument constant.

Another alternative for covariance processing is the Briggs method option, which determines the time at which the cross-covariance curve intersects with the auto-covariance function according to 3313. The crosswind speed W is then determined in 3317 by dividing the horizontal separation ρ of the channels 500(A) and 600(B) by 2 times the crossover time $t_c$.

As shown in FIG. 12, another possible option for cross-covariance processing is the Frequency method which, measures the width $t_f$ of the auto-covariance function at the half power point in 3312, and uses this value to calculate the wind speed W in 3316 according to the expression W=k'/$t_f$, where k' is an instrument constant.

Figure 18:
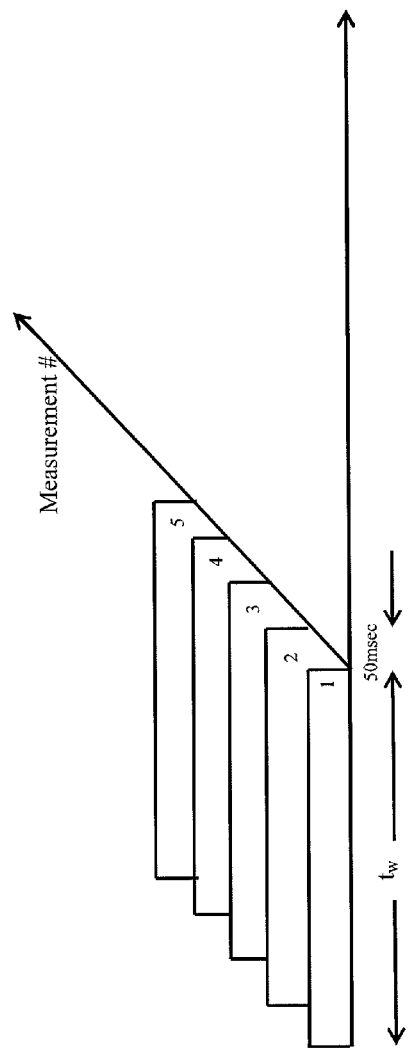
FIG. 18 illustrates a correspondence between measurements repeatedly collected over a period of time (e.g., while the user continues to press a switch) and repeated covariance calculations, which are used to update a confidence metric, according to an exemplary embodiment of the present invention.

The covariance calculations in 3310 and 3311 may be carried out using the data collected over the time $t_w$. To increase the measurement accuracy, however, multiple measurements may be made and averaged (while discarding improbable wind thresholds) to give the final answer. The data acquisition may continue for as long as the user maintains pressure on the wind measurement switch. Calculation of the first wind measurement result begins at $t_w$ after the wind measurement switch is activated, and the result is displayed once the data is processed. The typical value of $t_w$ is 500 msec but depending on the design can be longer or shorter. During the processing the data collection may continue and, after the processing of the first measurement is complete, the second calculation begins. The data for the second calculation consists of shifting the 500 msec selected for processing 50 msec ahead as illustrated in FIG. 18. With this approach, a 5 second data stream can yield 90 measurements to be averaged to improve the accuracy of the result. Depending on the conditions, the accuracy may be sufficient within the first second. Therefore, in addition to the wind result the display also shows a confidence metric (e.g., with marks 5004 and 5005 as shown in FIG. 19) based on the accuracy of the result as defined by the variance of the wind results. When the variance is below a selected threshold, regardless of the averaging time, the user can accept the current result with confidence that the probability of a hit will be high. The user can then terminate the data acquisition and use the current result.

It is contemplated that the crosswind can be measured with accuracy better than 0.5 m/sec to insure a high hit probability with the first round. Under most circumstances a point or local measurement of the wind is seen to vary significantly faster than a second or so compared to the projectile flight time of 2 to 3 sec. This would imply that the wind measurement would be latent and inaccurate to get a hit. Fortunately, what determines the projectile deflection is the path-averaged wind which changes at a much longer time constant than a second. The path averaged wind changes at a slower rate than the local wind because it is the average of all sequential local wind fluctuations over the entire path that the bullet experiences. For example if 1 m/s wind changes downrange at different rates, the overall rate will be slower than the slowest rate.

The XWS 100 makes multiple wind measurements and computes a cumulative average in order to reduce the measurement error which increases the accuracy. The averaging improves the accuracy so long as the variance of the individual readings is dominated by measurement error. At some time depending on the conditions however, the variance is due to actual changes in the path averaged wind. Extending the averaging time beyond this time increases the difference between the measured and the actual wind the projectile experiences in flight resulting in decrease of the hit probability.

The path-integrated wind, which is averaged over the time of projectile flight, changes with time. Field observations reveal that under some conditions the measured value remains effectively valid for 10 seconds or even longer. However, under other head or tail wind conditions, when the crosswinds are not full value, the value changes faster than 10 seconds. To avoid "obsolete" measurement the averaging of the measurements is done as a cumulative average up to 5 seconds and after that over the most recent 5 seconds of data. According to exemplary embodiments of the invention, the measurements, calculations, and display of the results may be automatically provided to the user within seconds, thereby providing a distinct advantage over systems where the time lag between wind measurement and firing time exceeds the time stability of the wind.

The signals derived by the summation of pixels surrounding the laser spots (e.g., in 3307 of FIG. 12) may include light from those spots due to sunlight illumination as well as the laser illumination. In some conditions, the sunlight background exceeds the laser contribution. To remove the common mode (sunlight) component from the signal prior to making the covariance calculation, the data acquisition for the wind measurement mode begins by acquiring several frames with the laser not yet turned on in 3303 of FIG. 12. These frames are averaged and subtracted (pixel by pixel) from the subsequent laser-on frames to remove the background component in 3306.

In an imaging mode, the sunlight background is the primary signal, along with the laser spot 116 on the target that provides confidence to the hunter that the laser 123 is aligned and has not shifted. To deal with the fact that laser signal is small compared to the sunlight, the image displayed to the user is the result of adding to the raw image data an enhanced laser image. The enhanced laser image is zero at all pixels outside of the area immediately surrounding the laser spot and for those pixels within the spot the pixel values are set close to saturation values.

2D Wind Algorithms:

Exemplary embodiments of the invention, as described above, are intended to measure the crosswind in the horizontal plane. In applications where there may be significant vertical winds, as well as horizontal winds, the aforementioned embodiments can be modified. Particularly, a third wind measurement channel can be added to the XWS 100 in such manner that the added channel is displaced vertically from the others 500 and 600. Thereafter, the same covariance techniques as described above in connection with FIG. 12 could be modified to account for time differences pertaining to detection results of vertically-separated channels.

It is also possible to measure crosswind speeds in both vertical and horizontal directions with a single aperture and channel. This approach tracks the movement of the scintillation pattern falling on the target due to the turbulence encountered on the trip from the shooter to the target. As described earlier, this technique requires a significantly more powerful laser and suffers from noise created by the turbulence encountered on the return trip. In the single-aperture approach, the covariance calculations are made between the signals from individual pixel-pairs in both directions.

The present invention provides a method and an instrument to measure two dimensional (azimuth and elevation) downrange winds from the shooter to the target, by integrating and averaging the effects of the wind changes and direction similar to that experienced by the bullet. It is noted that the winds in a third dimension, i.e., head or tail winds, may be experienced. However, such winds have a small effect on the hit point unless the shooter is moving rapidly at speeds greater than 30 meters per second toward or away from the target Tracking Moving Targets:

For moving targets, the XWS 100 may also be configured to track the target and generate a lead offset to compensate for the movement that is displayed as an icon 5008 (FIG. 19) to the user 207. The laser beam spot 116 as seen on the target image 210 would be used to track the targets position by moving the rifle to keep the laser spot 116 on the target image 210 (FIG. 7). The tracking angles could be measured by a gyroscope 806 (FIG. 13) that would provide the angular motion as a function of time allowing calculation of the required compensation offset and displayed to the user 207 by moving the OAP (offset aim point) 5007 (FIG. 19) or as a lead icon 5008 (FIG. 19)

Ballistic Calculator

Now reference will be made again to FIG. 11. Particularly, after the target range has been measured according to 3200, and/or a path-weighted average crosswind has been measured according to 3300, various ballistic calculations are performed in 3400, e.g., to determine an offset aim point 5007 to be displayed, e.g., on the target image.

According to an exemplary embodiment, the processor 1300 may perform any necessary ballistic calculations by solving well-known equations of motion for a projectile in flight. Such equations, and standard solution methods, can be found in McCoy, R., L., *Modern Exterior Ballistics*, Schiffer Military History, Atglen, Pa., 2012, the entire contents of which are herein incorporated by reference. The inputs to these equations may come from a combination of the target range and crosswind measurements, as described above in connection with FIG. 11 and FIG. 12, as well as information collected by the XWS 100, e.g., according to the process illustrated in FIG. 10.

Figure 10:
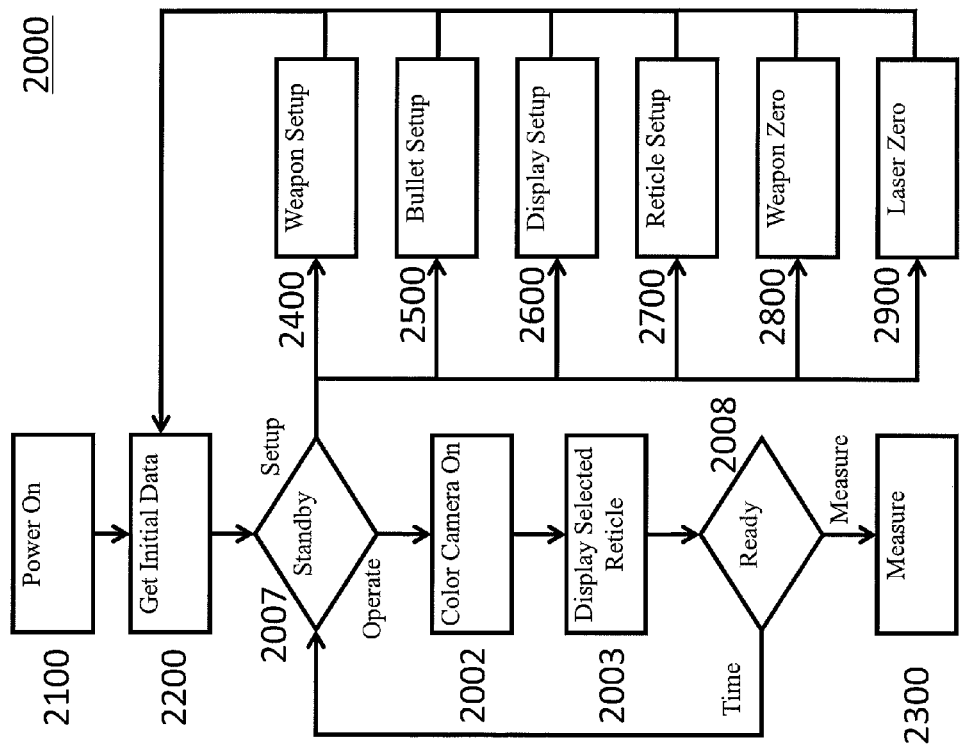
FIG. 10 is a flowchart illustrating a process of data collection for use by an electro-optic system in combination with range and crosswind measurements, according to an exemplary embodiment of the present invention.

FIG. 10 is a flowchart illustrating a process 2000 whereby the XWS 100 collects data which, in combination with the measured target range and crosswind measurements, can be used to perform ballistic calculations according to 3400 of FIG. 11. As shown in FIG. 10, after the XWS 100 is powered on in 2100, a data initialization process may be performed in 2200 to collect initial data. After data initialization, the XWS 100 may operation in a standby mode as shown in 2007. In this standby mode, a data setup operation may be initiated, automatically or by user operation. Particularly, various types of setup operations may be performed including those collecting data useful for ballistic calculations. Such setup operations may include a Weapon Setup operation (2400) which receives input data on the relevant weapon, such as barrel twist rate and height of the center of the scope above the center of the bore; and a Bullet Setup operation (2500) which receives input data such as muzzle velocity, bullet mass, bullet diameter, bullet length, custom bullet drag coefficient vs. Mach number curve, and bullet ballistic coefficient to calculate drag coefficient vs. Mach number using standard drag curves.

In FIG. 10, the user may also perform various setup operations to indicate various preferences, e.g., regarding the display setup (2600), reticle setup (2700). Other types of possible setup operations may be related to system and weapon alignment, such as the Weapon Zero (2800) and the Laser Zero (2900) operations which will be described in more detail below. In FIG. 10, after the setup data is collected, the XWS 100 may again enter the standby mode of 2007. In standby mode, a decision may also be made to start operating the image display functionality of the XWS 100. Accordingly, the image sensor may be turned in 2002, the appropriate reticles may be displayed overlaid on the target image in 2003, and the XWS 100 may be set in a ready mode in 2008 to wait for a user command to perform target range and crosswind measurements in 2300. However, in the ready mode (2008) of FIG. 10, the system 100 may revert back to standby mode (2007) in case of inactivity for a certain amount of time.

Now, referring again to ballistic calculations of 3400 in FIG. 11, other types of data in addition to the weapon setup data and the bullet setup data may be needed. These additional types of data may be collected from the local sensors 800 (FIG. 2). FIG. 13 illustrates particular types of local sensors 800 which may be used by a processor 1300 to perform the ballistic calculations. For instance, the processor 1300 may be able to obtain weapon heading data from the digital magnetic compass 801, firing latitude from the global positioning system 807, weapon elevation angle and weapon cant angle from the accelerometers 805; atmospheric pressure sensor 802, atmospheric humidity sensor 803, atmospheric temperature sensor 804, and a rate of change in weapon heading from the accelerometers 805.

Using as inputs the aforementioned collected data, in combination with the target range and path-weighted average crosswind measured according to FIG. 12, the processor 1300 performs the ballistic calculations of 3400 of FIG. 11. Based on these calculations, the processor 1300 may be able to calculate the angular difference between a bullet zero and the aim point that would cause the projectile to hit the target at the desired location in 3401. Accordingly, these angular differences are displayed (5003 in FIG. 19) as the holds in 3401, and used to calculate the location of the offset aim point in 3402. Also, if the user 207 is tracking a moving target with the weapon, accelerometer data (805 in FIG. 13) may be used to update the calculated holds 3401 and the offset aim point 3402 with the calculated lead angle 5008.

Switches

The user may interface with the XWS 100 using pushbutton switches 1000 (FIG. 2) that allow selection of ON/OFF, initiate the range measurement in 3200 (FIG. 11) and the crosswind measurement in 3300 (FIG. 11), align laser zero in 2900 (FIG. 10), align bullet zero in 2800 (FIG. 10), set reticle preferences in 2700 (FIG. 10), set display preferences in 2600 (FIG. 10), enter bullet setup in 2500 (FIG. 10), enter weapon setup in 2400 (FIG. 10), set magnification, and illuminate target.

Figure 14:
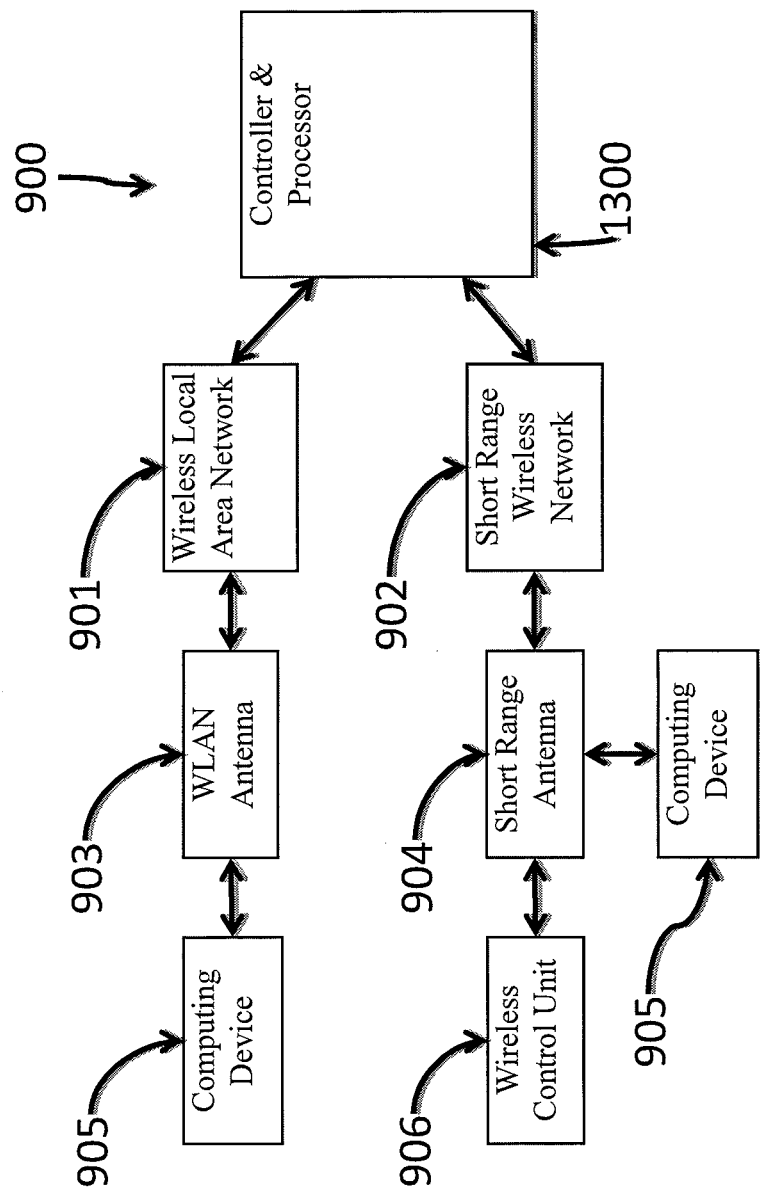
FIG. 14 is a block diagram illustrating various components in a wireless input/output (I/O) module for receiving input data (e.g., ammunition and weapon type) wirelessly, and also for wirelessly transmitting data (e.g., video clips, images and performance data), according to an exemplary embodiment of the present invention.

Alternatively, all of the setup and calibration data could be received via a wireless I/O system 900 (FIG. 2), e.g., from a wireless handheld computing device. Particularly, FIG. 14 illustrates various components in the wireless I/O system 900, which can be used to receive input for operating the system apart from the buttons 1000 mounted on the XWS 100, e.g., via a wireless control unit 906 or a computing device 905.

Battery and Power Conditioner

The system 100 runs on battery power 700 for extended periods. Because it is implemented as a portable rifle mounted system in exemplary embodiments, the weight of the battery is a significant parameter. Hence, minimizing the power draw is a prime objective. The internal scope design with the camera image sensor 120 as detector allows operation with a 170 mw CW laser. The laser 123 does not require cooling. This significantly increases the electrical efficiency to greater than 25% and hence power draw from the battery. Low power capability is made possible by the use of multiple aperture approach rather than single aperture approach and using a CMOS image sensor 113, 119 rather than an APD detector, as the detector for wind measurement.

XWS and Weapon Alignments

In the XWS system, the aim point optical axis of the laser 123 and the optical axis of each wind measurement channel 500 and 600 in FIGS. 5 and 6 may be factory-aligned to ensure that the angular misalignment between them is less than 50 micro radians. This may be done in the factory on a calibration fixture by bringing the laser spot reflected from a distant target (say 500 meters) to the center of the FOV of the color imaging sensor 120 and each of the wind signal sensors 113, 119. The electronic crosshair, pre-aligned to the color imaging view finder center, may then be driven by pushbutton toggle switches to the center of the laser spot which is visible in the wind signal sensor 113, 119, and the coordinates are set to (0,0) in the non-volatile memory. The parallax introduced is reduced by increasing the target distance or by knowing the offset between the receiver and laser beam axes that aligns the laser beam parallel to the receiver axis. This factory zero alignment is achievable to better than 50 micro radians.

According to an exemplary embodiment, the factory alignment may include a "weapon zeroing" operation, illustrated as 2800 in FIG. 10, as follows. If the XWS 100 is mounted directly to the rifle without a direct view optic (DVO) riflescope, the laser aim point may be zeroed to the rifle bore so that the projectile impact point coincides with the laser aim point. If the system is not integrated with the beam steering module 107, the electronic crosshair 5001 (FIG. 19) may be used instead. The position of the electronic crosshair in the view finder is moved by the toggle pushbutton switches to align with the center of the rifle bore instead of moving the laser beam 130.

To find the center of the rifle bore, two methods may be utilized. In the first method, the user 207 commands the device 100 to enter a laser zero setup mode. This causes, in reference to FIG. 19, the zeroed electronic crosshair 5001 to be displayed in the XWS view finder 5000. The electronic crosshair 5001 of the XWS 100 is placed at a fixed point on a target 115 (FIG. 4) at a known distance (approximately 100 to 150 meters (or less) to minimize any wind effects) and a series of shots are fired. The crosshair 5001 is then moved by pushbutton toggle switches so that its center coincides with the center of the cluster of hits on the target 115. The process is repeated to improve weapon zero alignment accuracy. In the second method, a bore-sighting visible laser inserted into the rifle bore could also be used, thus minimizing the expense of firing multiple shots. Once aligned, the new coordinates of the electronic crosshair with respect to the weapon bore, which may be different from the factory zero, are recorded in the memory, and the crosshair is returned to the factory zero. Returning the crosshair to factory zero guarantees the user the original position of the laser aim point angle. The difference in the coordinates determined from the alignments is used to correct the offset aim-point (OAP) 5007 that is displayed to the user in the wind and range measurement operations. This alignment procedure is called weapon zeroing, and remains valid until the XWS is removed from the weapon mount. This approach is preferred since it can be done through the software, without requiring a laser beam steering device such as Risleys or other mechanical means that add cost to the system. The only constraint of this approach is that it requires the total misalignment (including the XWS mounting hardware alignment to the rifle, the pic rail alignment to the rifle, and the XWS factory zeroing of the laser to the receiver channels) to be small compared to the optical field of view. Alignment analysis shows that this may be much smaller than 0.5 degree compared to 3 to 5 degree field of view of the XWS 100 system.

When the XWS 100 is used with an existing riflescope as a piggyback device, the alignment process is the same as described above except the riflescope must first be boresighted with the rifle bore. This may be done by firing a group of shots or using a boresighting laser inserted into rifle bore. To display the crosshair and offset aim point in the riflescope sight, an optical display assembly (such as an OLED or LCOS) mounted in front of the riflescope may be used.

If beam steering module 106 is integrated with the XWS 100 and set to steer equally in either direction, the misalignment tolerances may be loosened up by performing a "laser zeroing" allowing the laser line of sight (LOS) in to be aligned with the weapon zero boresight. In this procedure, the user 207 commands the device 100 to enter a Laser Zero setup mode, as illustrated in 2900 of FIG. 10. This causes, in reference to FIG. 19, the zeroed electronic crosshair 5001 to be displayed in the XWS view 5000. Using the laser beam steering module 106 (FIG. 3), the laser spot 116 is driven to coincide with the crosshair 5001 (FIG. 19). The procedure introduces parallax since the LOS and weapon zero is aligned at a finite distance ~500 meters. Alternatively, the laser path could be made parallel to the weapon zero 5001 eliminating the parallax.

Once the laser aim point (i.e., laser LOS) or the electronic crosshair is aligned with the weapon zero 5001, a pushbutton switch may be activated to cause the processor 1300 to redefine the co-ordinate system zero to the current position of the electronic crosshair zero 5001. The XWS 100 is then sighted-in. The laser aim point of the XWS 100 is properly aligned to the rifle bore and its angular position known to the user during operation.

Operating Procedure

In the preferred embodiment, the XWS 100 is mounted in place of the riflescope, and is used for target acquisition as well as wind/range measurement. Once a target has been identified, the hunter places the crosshair 5001 on the target and initiates a wind measurement 3300 (FIG. 11) and a range measurement 3200 (FIG. 11). The required offset aim point icon 5007 appears on the system's digital screen 5000 displayed as an overlay with the target image as shown in FIG. 19. The user then releases the measure-wind button 1000 to terminate the measurement, and moves his rifle to position the center of the icon 5007 on the target 115 he wishes to engage. Although shown as a cross, the aim point offset indicator 5007 could be programmed also as a square, a circle, etc. Likewise the size of the indicator can be modulated to indicate times when the uncertainty of the wind measurement is high. The uncertainty being based on the variance of the wind readings over some set time interval.

What is claimed is:

1. A portable integrated system encased in a housing comprising:
    an optical transmitter;
    an optical receiver;
    a display device; and
    a processor,
    wherein:
        the optical transmitter produces a collimated laser beam to illuminate a spot on the target,
        the optical receiver comprises first and second wind measurement channels separated in a horizontal direction by a predetermined distance to receive optical signals from light transmitted by the optical transmitter and scattered back from a target, and convert the optical signals to obtain time varying electrical signals,
        the processor processes the time varying electrical signals from the first and second wind measurement channels to determine a time delay from which a path-weighted average crosswind toward the target is calculated,
        the processor calculates, based on the path-weighted average crosswind and range, an offset aim point, and
        the offset aim point is displayed on the display device.

2. The system of claim 1, further comprising:
    a user interface allowing input of relevant ammunition and weapon data affecting a projectile hit point; and
    a plurality of sensors configured to measure environmental and ballistic parameters affecting a projectile hit point,
    wherein a ballistic calculator is used to calculate said offset aim point based on said measured environmental and ballistic parameters or said inputted data in addition to said path-weighted average wind and said range.

3. The system of claim 2, wherein the measured parameters used by the ballistic calculator to determine the offset aim point comprises one or more of the following: temperature, pressure, humidity, tracking lead angle, rifle cant, GPS coordinates, compass heading and rifle pitch.

4. The system of claim 1, wherein the system is mounted on one of: a rifle, gun, tripod, archer's bow and a crossbow.

5. The system of claim 4, wherein the optical transmitter produces a collimated laser beam that is bore-sighted to a rifle barrel, gun barrel, or scope crosshair.

6. The system of claim 5, wherein the optical receiver further comprises:
a range measurement channel; and
an image-capturing channel including a digital camera configured to create an image in the visible spectrum.

7. The system of claim 6, wherein the system displays an image captured by the image-capturing channel in order to simulate a scope-view of the target and surrounding area.

8. The system of claim 1, wherein the optical receiver further comprises optics to collect light from the laser beam, which is reflected from the target, onto the first and second wind measurement channels, each of the first and second wind measurement channels including an image sensor, or an APD (avalanche photo diode), or a PIN photodiode.

9. The system of claim 1, wherein the optical receiver further comprises:
a detector which measures a round trip time of flight between the optical transmitter and the target by narrow pulses of light, wherein a range to the target is calculated by the processor based on the measured round trip time.

10. The system of claim 1, wherein the optical receiver further comprises:
a digital camera which images the target and a surrounding area for display to a user based on daylight or laser illumination in the visible or infrared range.

11. The system of claim 10, wherein the display device is a synthetic eyepiece, which mimics a direct view optics eyepiece, and displays an image of the target and the surrounding area imaged according to the laser illumination or daylight.

12. A portable system comprising:
an optical transmitter;
an optical receiver;
a display device; and
a processor programmed to:
receive signals from the optical receiver that are representative of light transmitted by the optical transmitter and scattered back from a target,
process the received signals to determine a path-weighted average crosswind toward the target, and a range to the target, and
calculate, based on the path-weighted average crosswind and the range, an offset aim point,
wherein said offset aim point is displayed on the display device,
wherein the system is mounted on one of: a rifle, gun, tripod, archer's bow and a crossbow,
wherein the optical transmitter produces a collimated laser beam that is bore-sighted to a rifle barrel, gun barrel, or scope crosshair,
wherein the optical receiver comprises first and second wind measurement channels separated from one another in a horizontal direction by a predetermined distance,
wherein light from the laser beam, which is reflected from the target and travels back toward the system through atmospheric turbulence eddies which move with crosswinds, is detected by an image sensor via said first and second wind measurement channels, respectively, at a time delay based on crosswind speeds and the predetermined distance, and
wherein the path-weighted average crosswind in the horizontal direction is determined by measuring the time delay.

13. The system of claim 12, wherein the optical receiver further comprises a third wind measurement channel separated in a vertical direction from the first and second wind measurement channels by a second predetermined distance,
wherein light from the laser beam, which is reflected from the target and travels back toward the system through atmospheric turbulence eddies which move with crosswinds, is detected by a digital image sensor via said third wind measurement channel and one of said first and second wind measurement channels at a second time delay based on vertical crosswind speeds and the second predetermined distance, and
wherein the path-weighted average crosswind in the vertical direction is determined by measuring the second time delay.

14. The system of claim 13, wherein the image sensor for detecting light via each of the first and second wind measurement channels is a CMOS digital image sensor.

15. The system of claim 14, wherein the optical receiver further comprises reflective optics for directing light received via the first and second wind measurement channels for detection by the same CMOS digital image sensor.

16. The system of claim 13, wherein the image sensor for detecting light via each of the first and second wind measurement channels has a capture rate greater than the rate of change of the scintillation pattern.

17. The system of claim 13, further comprising two CMOS digital image sensors configured to detect the light received via the first and second wind measurement channels, respectively.

18. The system of claim 13, wherein the image sensor for detecting light via at least one of the first and second wind measurement channels is an APD (avalanche photodiode) or a PIN photodiode.

19. The system of claim 12, wherein the processor is further programmed to:
obtain repeated measurements of the time delay based on the detection results of the first and second wind measurement channels over a given time span,
calculate respective crosswind values corresponding to the repeated measurements, and
determine the path-weighted average crosswind by averaging the calculated crosswind values.

20. The system of claim 19,
wherein the processor is further programmed to calculate a confidence metric representing the accuracy of the determined path-weighted average crosswind based on a variance of the repeated measurements, and
wherein the display device outputs data indicative of the value of the confidence metric.

21. The system of claim 12, wherein the processor determines the path-weighted average crosswind according to one or more weighting functions which are applied to the detection results of the first and second wind measurement channels, the one or more weighting functions representing contributions from respective segments of a downrange crosswind.

22. The system of claim 21, wherein the processor determines the path-weighted average crosswind according to multiple weighting functions which are generated by changing the divergence of the laser beam transmitted by the optical transmitter.

23. The system of claim 21,
wherein the optical receiver obtains image data of a laser beam spot corresponding to a single beam divergence,
wherein the processor determines the path-weighted average crosswind by applying multiple weighting functions, which are generated by an angular-profile analysis of the laser beam spot, and wherein the processor performs the angular-profile analysis by extracting different spot sizes from the image data of the laser beam spot of the single divergence.

24. The system of claim 21, wherein the laser line width is greater than 0.5 nanometer.

25. The system of claim 21, further comprising:

an image-capturing channel; and a moveable electronic crosshair in the view finder to align the crosshair to the rifle bore, gun barrel bore or a reticle of a riflescope mounted to the weapon, wherein the electronic crosshair provides a misalignment offset in two orthogonal directions that is used to adjust the calculated offset aim point, and wherein the misalignment offset is determined by zeroing the laser beam to the first and second wind measurement channels and the image-capturing channel receiver channels, and then zeroing the electronic crosshair to the rifle bore, gun barrel bore or the reticle.

* * * * *